(12) United States Patent
Shinriki et al.

(10) Patent No.: US 6,806,211 B2
(45) Date of Patent: Oct. 19, 2004

(54) DEVICE AND METHOD FOR PROCESSING SUBSTRATE

(75) Inventors: Hiroshi Shinriki, Nirasaki (JP); Koji Homma, Kodaira (JP)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 10/344,281

(22) PCT Filed: Aug. 10, 2001

(86) PCT No.: PCT/JP01/06908

§ 371 (c)(1),
(2), (4) Date: Aug. 25, 2003

(87) PCT Pub. No.: WO02/15243

PCT Pub. Date: Feb. 21, 2002

(65) Prior Publication Data

US 2004/0026037 A1 Feb. 12, 2004

(30) Foreign Application Priority Data

Aug. 11, 2000 (JP) ........................ 2000-245193

(51) Int. Cl.⁷ .......................... H01L 21/31; C23C 16/00
(52) U.S. Cl. ...................... 438/785; 438/778; 438/935; 118/715; 118/719; 118/729
(58) Field of Search ............................... 438/758, 778, 438/785, 935; 118/715, 719, 728, 729

(56) References Cited

U.S. PATENT DOCUMENTS

| | | | | |
|---|---|---|---|---|
| 3,660,179 A | * | 5/1972 | Desmond et al. | 438/565 |
| 5,895,530 A | * | 4/1999 | Shrotriya et al. | 118/715 |
| 5,994,676 A | * | 11/1999 | Dutartre | 219/497 |
| 6,204,197 B1 | * | 3/2001 | Yamazaki | 438/763 |
| 2002/0014471 A1 | * | 2/2002 | Donohoe et al. | 216/67 |
| 2003/0033980 A1 | * | 2/2003 | Campbell et al. | 118/715 |
| 2003/0186560 A1 | * | 10/2003 | Hasebe et al. | 438/778 |

FOREIGN PATENT DOCUMENTS

| | | |
|---|---|---|
| EP | 606737 | 7/1994 |
| JP | 49-42858 | 4/1974 |
| JP | 2-30119 | 1/1990 |
| JP | 4-186825 | 7/1992 |
| JP | 7-94419 | 4/1995 |
| JP | 7-321056 | 12/1995 |
| JP | 9-162129 | 6/1997 |
| JP | 2000-12470 | 1/2000 |
| JP | 2000-54145 | 2/2000 |

* cited by examiner

Primary Examiner—Alexander Ghyka
(74) Attorney, Agent, or Firm—Crowell & Moring LLP

(57) ABSTRACT

A substrate processing apparatus consists of: a processing container; a first processing gas supply unit and a second processing gas supply unit, countering each other, prepared on both sides of a substrate-to-be-processed to the processing container; and a first slit-shaped exhaust opening and a second slit-shaped exhaust opening provided one on each side of the substrate-to-be-processed approximately perpendicular to the flow of the first processing gas and the second processing gas, countering the first processing gas supply unit and the second processing gas supply unit, respectively. The first processing gas is passed along the surface of the substrate-to-be-processed from the first processing gas supply unit to the first exhaust opening, and is adsorbed by the surface of the substrate-to-be-processed. Then, the second processing gas is passed along the surface of the substrate-to-be-processed from the second processing gas supply unit to the second exhaust opening, the second processing gas reacts with molecules of the first processing gas previously adsorbed, and a high dielectric film of a single-molecule layer is formed.

67 Claims, 28 Drawing Sheets

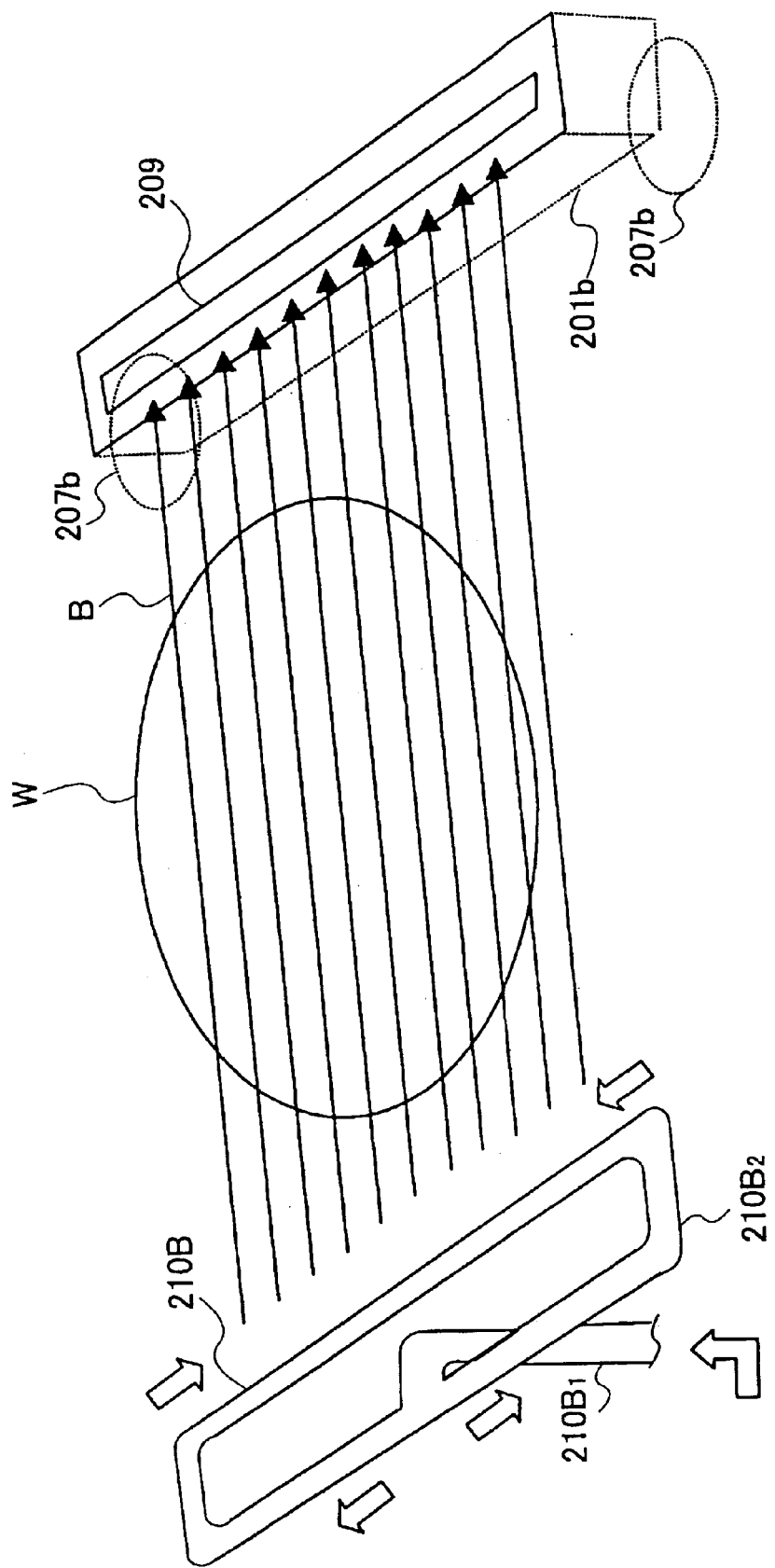

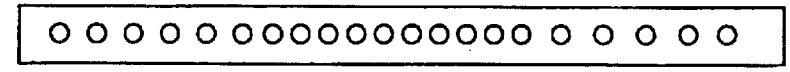
FIG.23A
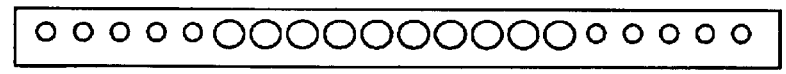
FIG.23B
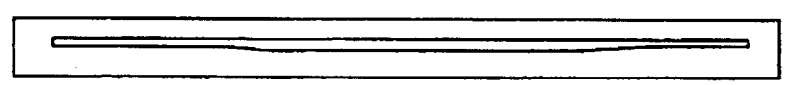
FIG.23C
FIG.24
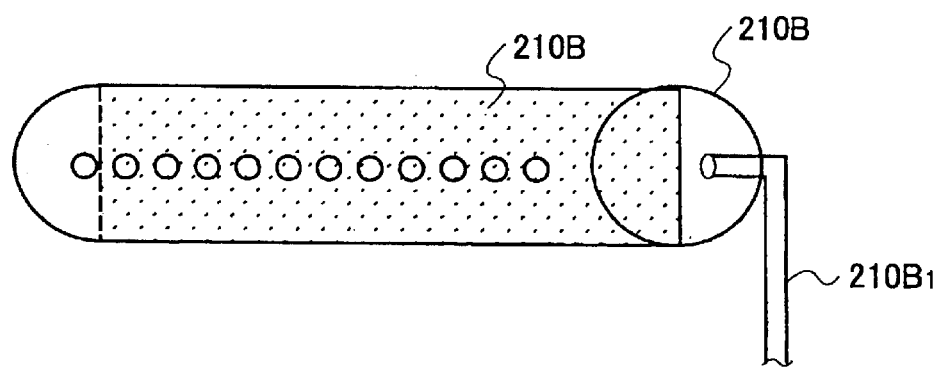

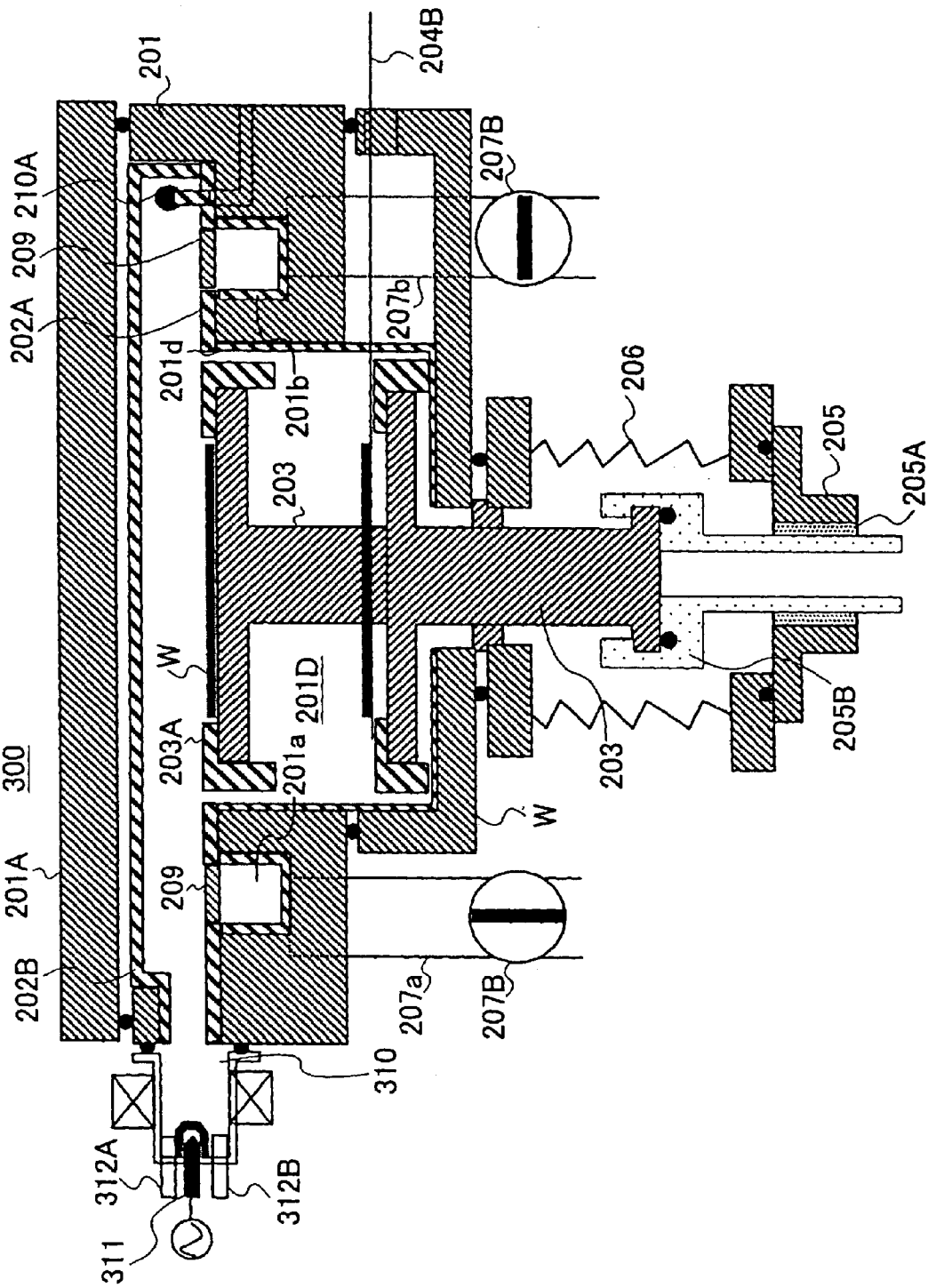

DEVICE AND METHOD FOR PROCESSING SUBSTRATE

BACKGROUND OF THE INVENTION

1. Field of the Invention

The present invention generally relates to a semiconductor device, and especially relates to a substrate processing apparatus and a substrate processing method used in manufacturing a super-miniaturized high-speed semiconductor device that includes a high dielectric film.

Recently, in ultra high-speed semiconductor devices, gate length of 0.1 micrometer or less has been realized with progress in miniaturized processing. Although the operation speed of semiconductor devices generally improves with miniaturization, film thickness of a gate insulation film of a miniaturized semiconductor is required to be decreased in correspondence to shortening of gate length by miniaturization according to a scaling rule.

2. Description of the Related Art

When the gate length is set to 0.1 micrometer or less, the thickness of a gate insulation film is required to be 1 or 2 nm, or even less, in the case that $SiO_2$ is used. In the gate insulation film that is thin such as above, there is an inevitable problem that tunnel current increases, and, as the result, gate leak current increases.

For this reason, it has been proposed that a high dielectric material, such as $Ta_2O_5$, $Al_2O_3$, and $ZrO_2$, $HfO_2$, $ZrSiO_4$ and $HfSiO_4$, be applied to the gate insulation film, in which case, actual film thickness may become greater than the conventional film of $SiO_2$. However, film thickness providing insulation equivalent to an $SiO_2$ film is smaller, since the dielectric constant is higher than the $SiO_2$ film. By using the high dielectric material such as above, a gate insulation film of about 2–5 nm thick can be used in an ultra high-speed semiconductor device where the gate length is 0.1 $\mu$m or less, enabling the control of the gate leak current that arises from the tunnel effect.

When forming a high dielectric gate insulation film such as above on a Si substrate, the gate insulation film is required to be formed on a very thin $SiO_2$ base oxidization film that is formed on the Si substrate in thickness less than 1 nm, typically less than 0.8 nm, in order to suppress spreading of a metallic element that constitutes the high dielectric gate insulation film in the Si substrate. In this case, the dielectric gate insulation film is required to be formed such that defects, such as boundary layer, may not be produced in the film. Further, when forming the high dielectric gate insulation film on the base oxidization film, it is desirable that the composition of the gate insulation film be such that the main component near the base oxidization film is SiO2, and the main component toward the upper surface of the high dielectric gate insulation film is the high dielectric material with gradual changes.

In order to form the high dielectric gate insulation film without defect, a plasma process in which charged particles are used cannot be employed. If the high dielectric gate insulation film is formed by the plasma CVD method, for example, a defect that acts as a trap of a hot carrier will be formed on the film as a result of plasma damage.

On the other hand, if the high dielectric gate insulation film is formed by the thermal CVD method, film thickness changes sharply due to the properties of the base insulation film used as the base, as has been found out by the inventor of the present invention. In other words, if the high dielectric gate insulation film is formed by the conventional CVD method, the film surface becomes irregular, and a gate electrode provided to the irregular surface of the gate insulation film causes degradation of the operating characteristics of the semiconductor device.

SUMMARY OF THE INVENTION

Accordingly, it is a general object of the present invention to provide a new and useful substrate processing method and processing apparatus that solve the problems described above.

A more specific object of the present invention is to provide a substrate processing apparatus and a substrate processing method for efficiently forming a high dielectric film on a substrate without a defect.

Another object of the present invention is to provide a substrate processing apparatus that includes:

a processing container, a substrate holding stand prepared for holding a substrate-to-be-processed in the processing container, a first processing gas supply unit that is provided to a first side of the substrate holding stand in the processing container, and supplies a first processing gas to the surface of the substrate-to-be-processed held on the substrate holding stand such that the first processing gas flows along the surface of the substrate-to-be-processed from the first side toward a second side that counters the first side, a first exhaust opening provided to the second side of the substrate holding stand in the processing container, a second processing gas supply unit that is provided to the second side of the substrate holding stand in the processing container, and supplies the second processing gas to the surface of the substrate-to-be-processed on the substrate holding stand such that the second processing gas flows from the second side toward the first side along the surface of the substrate-to-be-processed, and a second exhaust opening provided to the first side of the substrate holding stand in the processing container.

Another object of the present invention is to provide a substrate processing method using a substrate processing apparatus equipped with a processing container that includes a substrate holding stand prepared in the processing container for holding the substrate-to-be-processed, a first processing gas supply unit provided to a first side of the substrate holding stand in the processing container, a first exhaust opening provided to a second side that counters the first side of the substrate holding stand in the processing container, a second processing gas supply unit provided to the second side of the substrate holding stand in the processing container, and a second exhaust opening provided to the first side of the substrate holding stand in the processing container, which includes a step for performing a first process to the surface of the substrate-to-be-processed, wherein the first processing gas flows from the first processing gas supply unit on the first side toward the second side along the surface of the substrate-to-be-processed, and a step for performing a second process to the surface of the substrate-to-be-processed, wherein the second processing gas flows from the second processing gas supply unit on the second side toward the first side along the surface of the substrate-to-be-processed, where, in the process that performs the first process, discharging volume of the second exhaust opening is set smaller than discharging volume of the first exhaust opening, and, in the process that performs the second process, the discharging volume of the first exhaust opening is set smaller than the discharging volume of the second exhaust opening.

Another object of the present invention is to provide a substrate processing apparatus that includes:

a processing container, a substrate holding stand prepared for holding the substrate-to-be-processed in the processing container, a processing gas supply unit that is provided to a first side of the substrate holding stand in the processing container, and supplies a processing gas to the surface of the substrate-to-be-processed on the substrate holding stand such that the processing gas flows from the first side toward a second side that counters the first side along the surface of the substrate-to-be-processed, a first exhaust opening provided to the second side of the substrate holding stand in the processing container, a radical source that is provided on the second side of the substrate holding stand in the processing container, and supplies radicals to the surface of the substrate-to-be-processed on the substrate holding stand such that the radicals flow from the second side toward the first side along the surface of the substrate-to-be-processed, a second exhaust opening provided on the first side of the substrate holding stand in the processing container.

According to the present invention, a high dielectric film can be formed by laminating single-molecule layers on the substrate-to-be-processed by providing the first and second processing gas supply units on both sides of the substrate-to-be-processed in the processing container, countering each other, providing the first and second exhaust openings located on both sides of the substrate-to-be-processed, each opening countering with the first and second processing gas supply units, respectively, supplying the first processing gas supply unit, the first processing gas flowing along the surface of the substrate-to-be-processed, and being discharged from the first exhaust opening, and supplying the second processing gas or radicals from the second processing gas supply unit or the source of the radicals, respectively, the second processing gas or the radicals flowing along the surface of the substrate-to-be-processed, reacting with molecules of the first processing gas, which are previously absorbed by the surface of the substrate-to-to-processed, and being discharged from the second exhaust opening.

Other objects and features of the present invention will become clear from the detailed explanation about the preferred embodiments of the present invention described below.

BRIEF DESCRIPTION OF THE DRAWINGS

FIG. 22 shows details of a part of the substrate processing apparatus shown by FIG. 19;

FIGS. 23A through 23C show details of a part of FIG. 22;

FIG. 24 shows details of a part of FIG. 22;

FIG. 30 shows a configuration of the substrate processing apparatus according to the eleventh embodiment of the present invention.

DESCRIPTION OF THE PREFERRED EMBODIMENTS

[Principle]

Figure 1A:
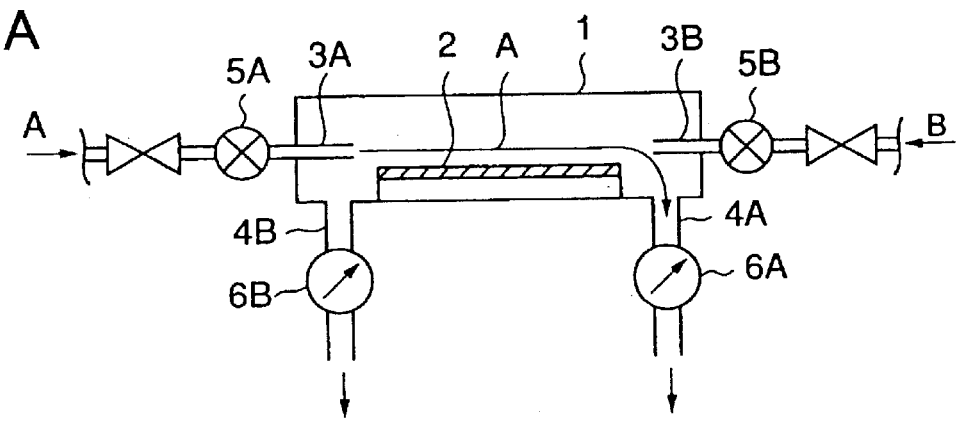
FIGS. 1A and 1B are for explaining the principle of the present invention.
Figure 1B:
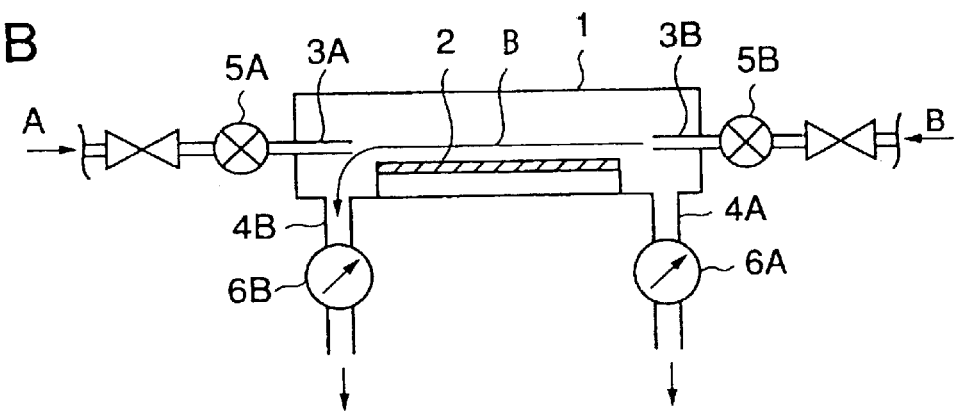

FIGS. 1A and 1B show the principle of the present invention.

With reference to FIGS. 1A and 1B, a substrate-to-be-processed 2 is held in a processing container 1, a first processing gas supply unit 3A is provided on a first side of the substrate-to-be-processed 2, and a first exhaust opening 4A is provided on a second side that counters the first side of the substrate-to-be-processed 2. Further, a second processing gas supply unit 3B is provided on the second side of the processing container 1, and a second exhaust opening 4B is provided on the first side. A first processing gas A is supplied to the first processing gas supply unit 3A through a first material switching valve 5A, and a second processing gas B is supplied to the second processing gas supply unit 3B through a second material switching valve 5B. Furthermore, the first exhaust opening 4A exhausts through a first exhaust volume adjustment valve 6A, and the second exhaust opening 4B exhausts through a second exhaust volume adjustment valve 6B.

First, at the process of FIG. 1A, the first processing gas A is supplied to the first processing gas supply unit 3A through the first material switching valve 5A, and the first processing gas A is adsorbed by the surface of the substrate-to-be-processed in the processing container 1. At this time, the first processing gas flows along the surface of the substrate-to-be-processed in a first direction, that is, from the first processing gas supply unit 3A to the first exhaust opening 4A by driving (controlling) the first exhaust opening 4A that counters the first processing gas supply unit 3A.

Next, in the process shown by FIG. 1B, the second processing gas B is supplied to the second processing gas supply unit 3B through the second material switching valve 5B, and the second processing gas B flows along the surface of the substrate-to-be-processed 2 in the processing container 1. As the result, the second processing gas B reacts with molecules of the first processing gas that is previously adsorbed by the surface of the substrate-to-be-processed, and a high dielectric molecule layer is formed on the surface of the substrate-to-be-processed. At this time, the second processing gas flows along the surface of the substrate-to-be-processed in a second direction, that is, from the second processing gas supply unit 3B to the second exhaust opening 4B by controlling the second exhaust opening 4B that counters the second processing gas supply unit 3B.

Furthermore, by repeating the process shown by FIGS. 1A and 1B, a desired high dielectric film is formed on the substrate-to-be-processed 2.

While the process shown by FIG. 1A is performed, the supply of the second processing gas B to the second processing gas supply unit 3B through the second material switching valve 5B is intercepted. Further, while the process shown by FIG. 1B is performed, the supply of the first processing gas A to the first processing gas supply unit 3A through the material switching valve 5A is intercepted. In order to prevent the first processing gas A supplied by the first processing gas supply unit 3A from invading the second processing gas supply unit 3B that counters, and producing a deposit material in the process of FIG. 1A, it is desirable to supply an inactive gas to the second processing gas supply unit 3B from the second material switching valve 5B while the process of FIG. 1A is performed. Similarly, it is desirable to supply an inactive gas to the first processing gas supply unit 3A from the first material switching valve 5A while the process of FIG. 1B is performed.

Furthermore, while the first exhaust volume adjustment valve 6A is set wide open during the process of FIG. 1A, such that the first processing gas that passed through the surface of the substrate-to-be-processed 2 is exhausted, it is desirable that the second exhaust volume adjustment valve 6B be set to a small opening of 3% or less, for example, rather than completely shut in view of valve opening-and-closing operation at a high temperature. Similarly, it is desirable that the opening of the first exhaust volume adjustment valve 6A be set to a small opening of 3% or less, rather than completely shut during the process of FIG. 1B where the second exhaust volume adjustment valve 6B is set wide open.

The processing container is desirably formed in flat form such that the first and the second processing gases flow along the surface of the substrate-to-be-processed 2 in a sheet-like laminar flow, and, similarly, it is desirable that the first and the second processing gas supply units 3A and 3B be formed in flat form, each having a slit-like opening. Furthermore, it is desirable to form the first and the second exhaust openings 4A and 4B each in the shape of a slit that extends in a direction approximately rectangular the direction of the flow of the first and the second processing gases, respectively. Further, the sheet-like flow of the processing gas is not disturbed by being evenly exhausted downward through the slit that extends perpendicularly to the direction of the flow of the processing gas.

By the substrate processing apparatus of the present invention, an oxide layer of Zr, Al, Y, Ti, or La can be formed on the substrate-to-be-processed by using materials that contain Zr, Al, Y, Ti, or La, respectively, as the first processing gas, and using an oxidizing gas as the second processing gas.

Furthermore, by the substrate processing apparatus of the present invention, an oxide layer of three elements, such as ZrSiOx, HfSiOx, AlSiOx, YSiOx, TiSiOx, LaSiOx, ZrAlOx, HfAlOx, YAlOx, TiAlOx, and LaAlOx, can be formed on the substrate-to-be-processed by using a film formation gas different from the first processing gas as a third processing gas, and combing the third processing gas with the second processing gas.

In the case of the substrate processing apparatus of the present invention shown in FIGS. 1A and 1B, after the process of FIG. 1A wherein the processing gas A is supplied from the processing gas supply unit 3A to the processing container 1, a purge gas or the processing gas B is supplied from the processing gas supply unit 3B in the process of FIG. 1B, then, the processing gas A that may remain in the processing container 1 rides the flow of the purge gas or the processing gas B, and is discharged promptly through the exhaust opening 4B, and the density of the processing gas A residual in the processing container 1 falls rapidly. Similarly, after the process of FIG. 1B wherein the processing gas B is supplied from the processing gas supply unit 3B to the processing container 1, a purge gas or the processing gas A is supplied from the processing gas supply unit 3A, when the process of FIG. 1A is repeated, and then, the processing gas B that may remain in the processing container 1 rides the flow of the purge gas or the processing gas A, and is discharged promptly from the exhaust opening 4A, and the density of the processing gas B residual in the processing container 1 falls rapidly.

Especially, with the apparatus of the present invention, even if the processing gas B residues at several percent of density nearby the processing gas supply unit 3B that supplies the processing gas B, the residual gas is exhausted by switching the active exhaust opening from the exhaust opening 4B to the exhaust opening 4A. In this manner, the density of the processing gas B becomes sufficiently low in the region in which the substrate-to-be-processed 2 is arranged, and processing by the processing gas A is not influenced.

In contrast, with a substrate processing apparatus that is configured without the processing gas supply unit 3B and the corresponding exhaust opening 4B, even if a processing gas supplied from the processing gas supply unit 3A is switched from the processing gas A to the purge gas or the processing gas B, the processing gas A tends to remain in the processing container 1, and it takes a long time for the density of the processing gas A residual to fall sufficiently for performing the processing gas B.

In the present invention, it is also possible to provide a process wherein a gas is exhausted from both ends of the substrate-to-be-processed between the processing step using the processing gas A and the processing step using the processing gas B, such that the processing gas is exhausted more efficiently than the conventional apparatus that exhausts only from one side.

Thus, the substrate processing apparatus of the present invention shown in FIGS. 1A and 1B has the advantage that the cycle time for processing a substrate-to-be-processed is shortened by alternately supplying the processing gases A and B.

[The First Embodiment]

Figure 2:
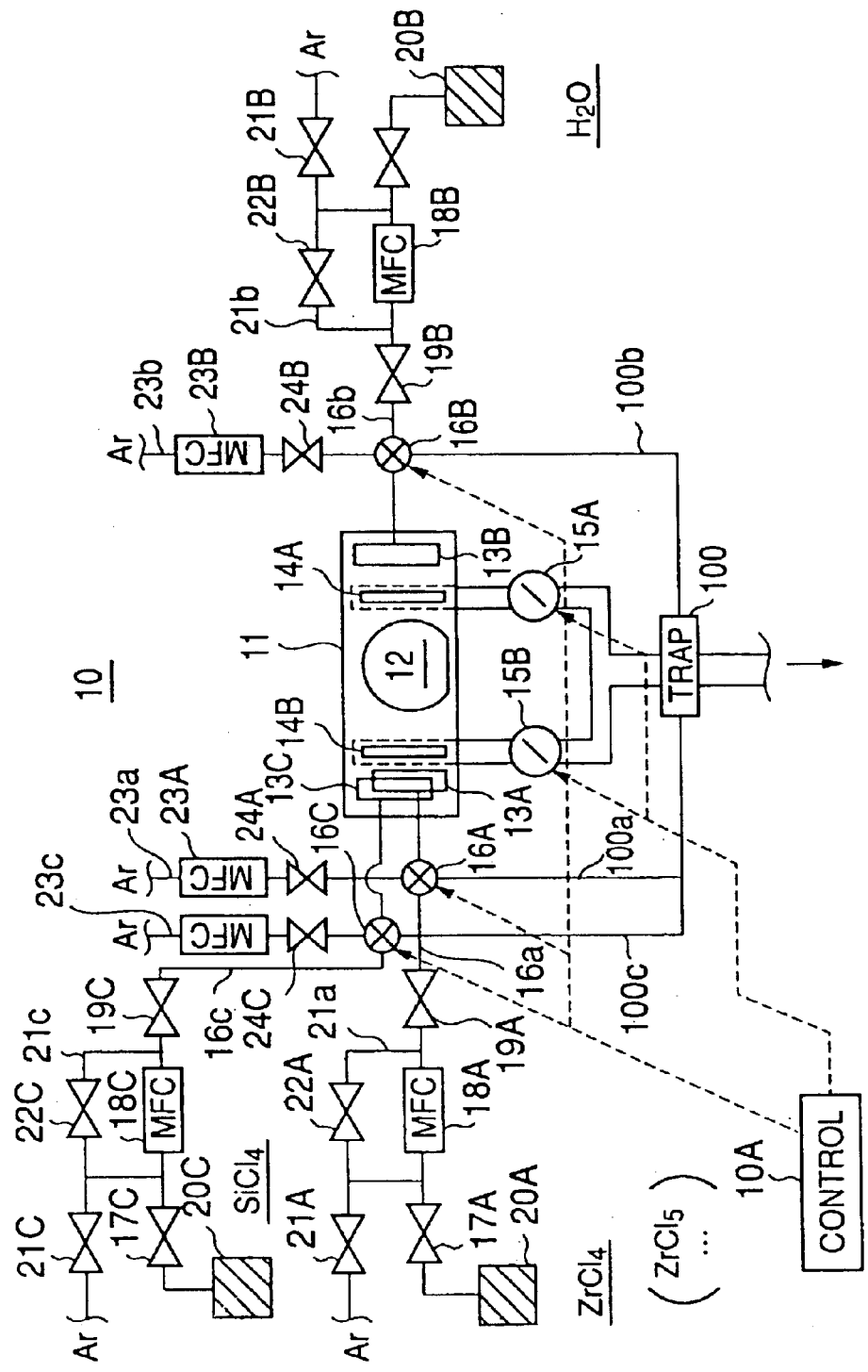
FIG. 2 shows a configuration of a substrate processing apparatus according to the first embodiment of the present invention.

FIG. 2 shows a configuration of a substrate processing apparatus 10 according to the first embodiment of the present invention.

With reference to FIG. 2, the substrate processing apparatus 10 includes a processing container 11 that further includes processing gas supply units 13A and 13B on the both ends of a substrate-to-be-processed 12, countering each other; and exhaust openings 14A and 14B on the both ends of the substrate-to-be-processed 12, countering the processing gas supply units 13A and 13B, respectively. Here, the exhaust openings 14A and 14B are connected to a trap 100 through conductance valves 15A and 15B, respectively, and a gas in the processing container 11 is exhausted through the trap 100.

Further, another processing gas supply unit 13C is provided adjacent to the processing gas supply unit 13A in the processing container 11 with the countering exhaust opening 14A.

The processing gas supply unit 13A is connected to a first exit of a switching valve 16A, and the switching valve 16A is connected to a material container 20A that contains $ZrCl_4$ through a first material supply line 16a that includes a valve 17A, a mass flux controller 18A, and another valve 19A. Furthermore, adjacent to the first material supply line 16a, a purge line 21a that includes valves 21A and 22A, and supplies an inactive gas, such as Ar, is prepared.

Further, the switching valve 16A is connected to a purge line 23a that contains a mass flux controller 23A and a valve 24A, then to a source of an inactive gas, such as Ar. A second exit of the switching valve 16A is connected to the trap 100 through a purge line 100a.

Similarly, the processing gas supply unit 13B is connected to the first exit of a switching valve 16B, and the switching valve 16B is connected to a material container 20B that contains $H_2O$ through a second material supply line 16b that includes a valve 17B, a mass flux controller 18B, and another valve 19B. Furthermore, adjoining to the second material supply line 16b, a purge line 21b that includes valves 21B and 22B, and supplies an inactive gas, such as Ar, is prepared.

Furthermore, the switching valve 16B is connected to a purge line 23b containing a mass flux controller 23B and a valve 24B, then to a sources of an inactive gas, such as Ar, and the second exit of the switching valve 16B is connected to the trap 100 through a purge line 100b.

Furthermore, the processing gas supply unit 13C is connected to a first exit of a switching valve 16C, and the switching valve 16C, is connected to a material container 20C that contains SiCl4 through a third material supply line 16c that includes a valve 17C, a mass flux controller 18C, and another valve 19C. Furthermore, adjoining to the third material supply lone 16c, a purge line 21c that includes valve 21C and 22C, and supplies an inactive gas, such as Ar, is prepared.

Furthermore, the switching valve 16C is connected to a purge line 23c that includes a mass flux controller 23C and a valve 24C, then to a source of an inactive gas, such as Ar. A second exit of the switching valve 16C is connected to the trap 100 through a purge line 100c.

The substrate processing apparatus 10 shown be FIG. 2 further includes a control unit 10A for controlling the process of film formation. The control unit 10A further controls the switching valves 16A through 16C and the conductance valves 15A and 15B, which will be explained in detail later with reference to FIGS. 4 through 7.

Figure 3:
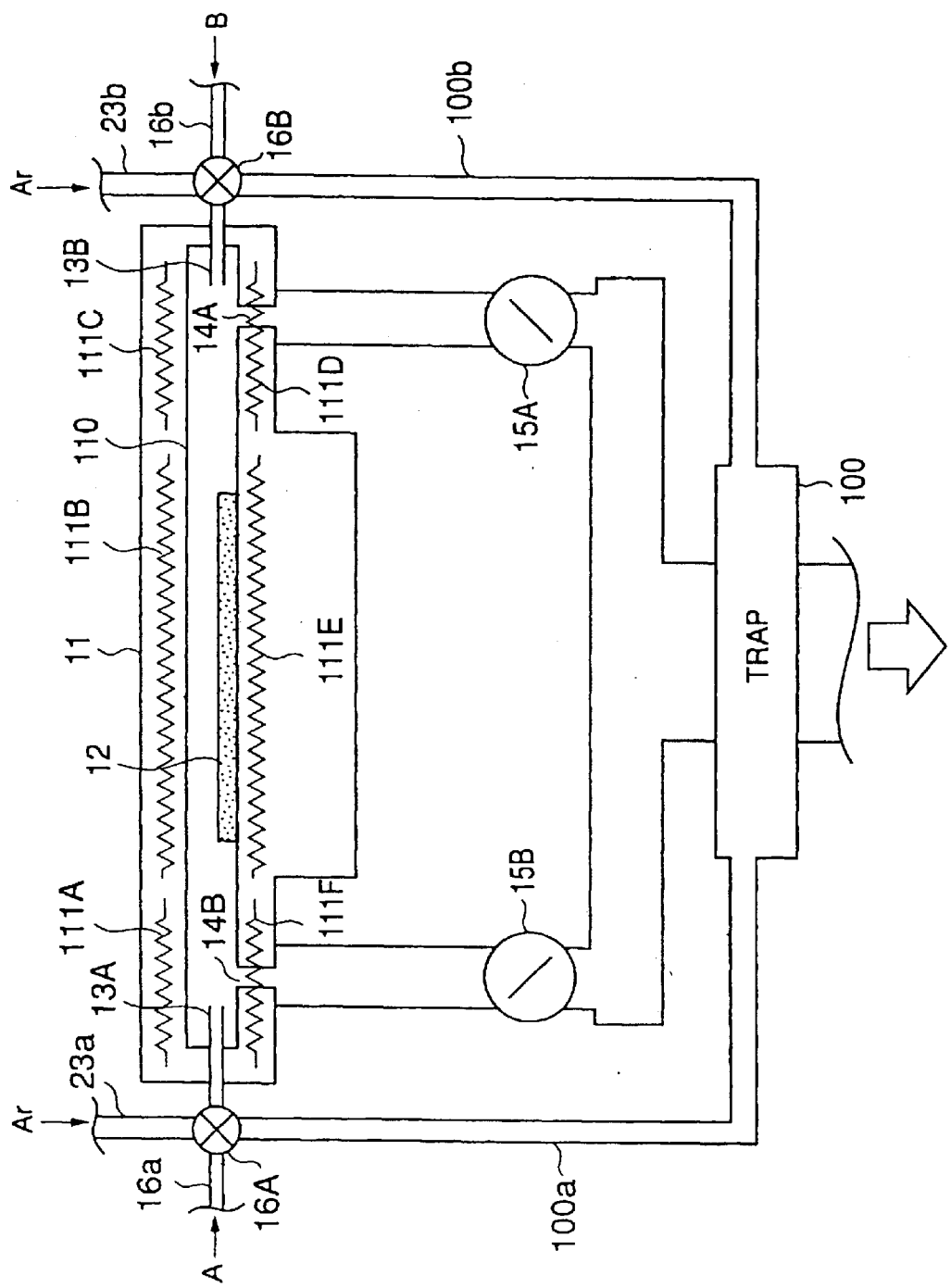
FIG. 3 shows details of a part of the substrate processing apparatuses shown by FIG. 2.

FIG. 3 shows details of a portion including the processing container 11 of FIG. 2.

With reference to FIG. 3, a quartz reaction container 110 is prepared in the processing container 11, and the substrate-to-be-processed 12 is held in the quartz reaction container 110. Heaters 111A–111F are prepared, adjacent to the quartz reaction container 110 in the processing container 11, such that substrate temperature is held to a predetermined processing temperature.

Further, the processing gas supply units 13A and 13B are formed in flat form, and provided at a slightly higher position than the substrate-to-be-processed 12 so that a processing gas may flow along the surface of the substrate-to-be-processed 12. Further, in connection with this, the quartz reaction container 110 is also formed in flat form, and, as a result, the first processing gas, such as ZrCl4 supplied from the processing gas supply unit 13A flows in a laminar flow along the surface of the substrate-to-be-processed 12 in the quartz reaction container 110, and is discharged from the exhaust opening 14A. At this occasion, the first processing gas is adsorbed by the surface of the substrate-to-be-processed, and the surface of the substrate-to-be-processed is covered by molecules of the processing gas in a thickness of about 1 molecule layer. The second processing gas, such as $H_2O$, supplied from the processing gas supply unit 13B forms a laminar flow along the surface of the substrate-to-be-processed 12 in the quartz reaction container 110, and is discharged from the exhaust opening 14A. At this occasion, the molecules of the first processing gas, which cover the surface of the substrate-to-be-processed 12 react, and, as the result, a very thin film of $ZrO_2$ in thickness of about 1 molecule layer is formed on the surface of the substrate-to-be-processed 12.

Accordingly, a high dielectric thin film, such as of $ZrO_2$, can be formed on the surface of the substrate-to-be-processed 12 by repeating the absorption process and the reaction process, with a purge process inserted in between. Further, after forming the $ZrO_2$ molecule layer, a third processing gas, such as $SiCl_4$, can be supplied from the processing gas supply unit 13C such that a $SiO_2$ molecule layer is formed on the $ZrO_2$ molecule layer, and a high dielectric film of $ZrSiO_4$ is formed by repeating such processes, performing a purge process in between. For example, when forming a ZrSiO4 film on the substrate-to-be-processed 12, the substrate-to-be-processed 12 is held at temperature of 200–450 degrees C., the $ZrCl_4$ gas and the $SiC_4$ gas are supplied at a flux rate of 1–1000 SLM and 0.1–1000 SLM, respectively, with the internal pressure of the quartz reaction container 110 being set at 0.13–13.3 kPa (1–100 Torr), and using an inactive gas as a carrier gas. Increasing the flux of the inactive gas is effective in forming a uniform laminar flow. The flux of the inactive gas is set within a range of 1 to 100 times at large as the flux of a processing gas.

Although illustration is omitted in FIG. 3, the processing gas supply unit 13C for supplying the SiCl4 is provided in parallel with the processing gas supply unit 13A.

In this embodiment, the material stored in the material container 20A is not limited to $ZrCl_4$, but may be $HfCl_4$, $TaCl_5$, and the like. At room temperature, there materials are solids, and in order to evaporate, they are heated to a temperature higher than 200 degrees C., while supplying a carrier gas, such as Ar, to the material container 20A.

Figure 4A:
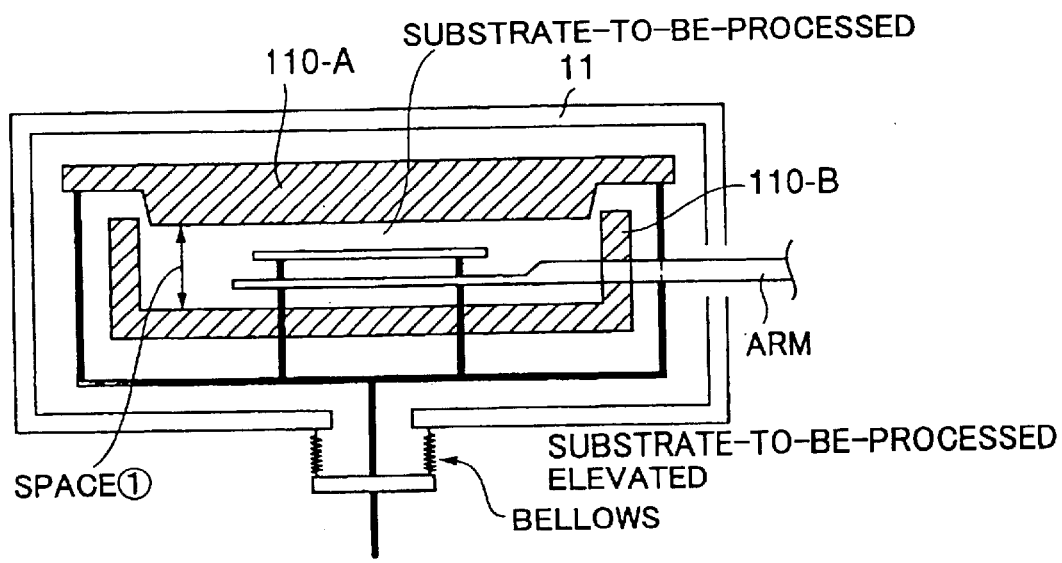
FIGS. 4A and 4B show an example of a variation of the substrate processing apparatus shown by FIG. 3.
Figure 4B:
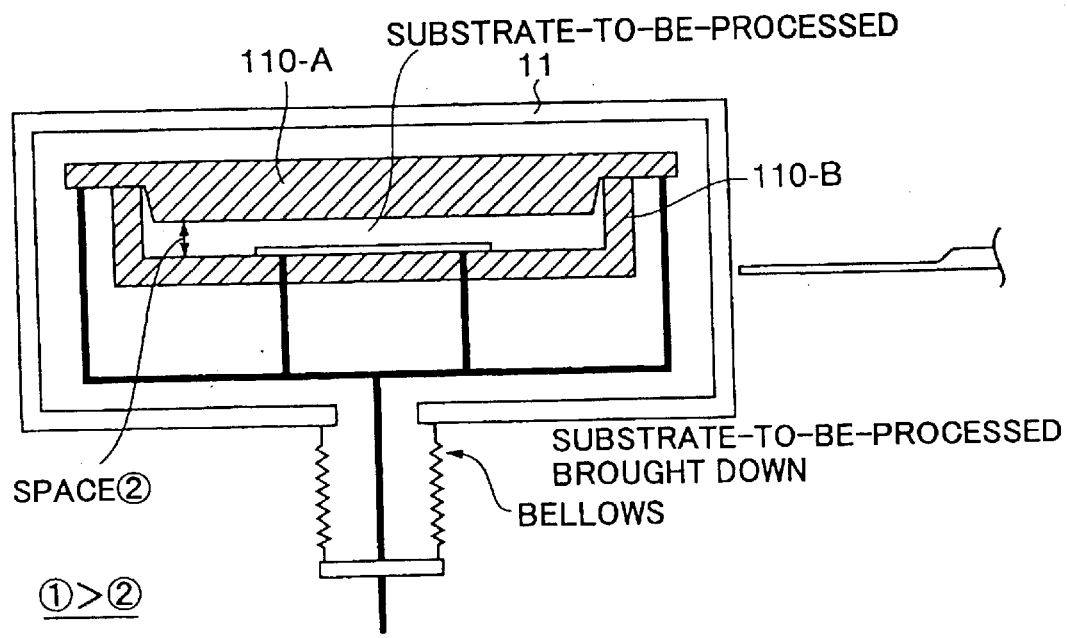

FIGS. 4A and 4B shows an example of a configuration of a reaction container 110 of a variation of the first embodiment of the present invention, wherein the distance between an upper part 110A and a lower part 110B of the quartz reaction container 110 while transporting shown by FIG. 4A is carried out is smaller than while a process shown by FIG. 4B is carried out, which is realized by moving the upper part 110A in the vertical direction, interlocking with a vertical movement of a transportation arm that transports a substrate-to-be-processed in the processing container 11. That is, the quartz reaction container 110 is constituted from the upper part 110A and the lower part 110B, according to this embodiment.

In this manner, with reference to FIGS. 4A and 4B, a material gas can flow uniformly along the surface of the substrate-to-be-processed by shortening the distance between the upper part 110A and the lower part 110B of the quartz reaction container 110 when processing. Here, although the vertical movement of the upper part 110A of the quartz reaction container is interlocked with the vertical movement of the substrate-to-be-processed in the configuration shown by FIGS. 4A and 4B, the interlocking is not a prerequisite if a configuration is such that the distance between a substrate-to-be-processed and the upper part 110A of the quartz reaction container is reduced during processing and increased during transporting.

[The Second Embodiment]

Figure 5:
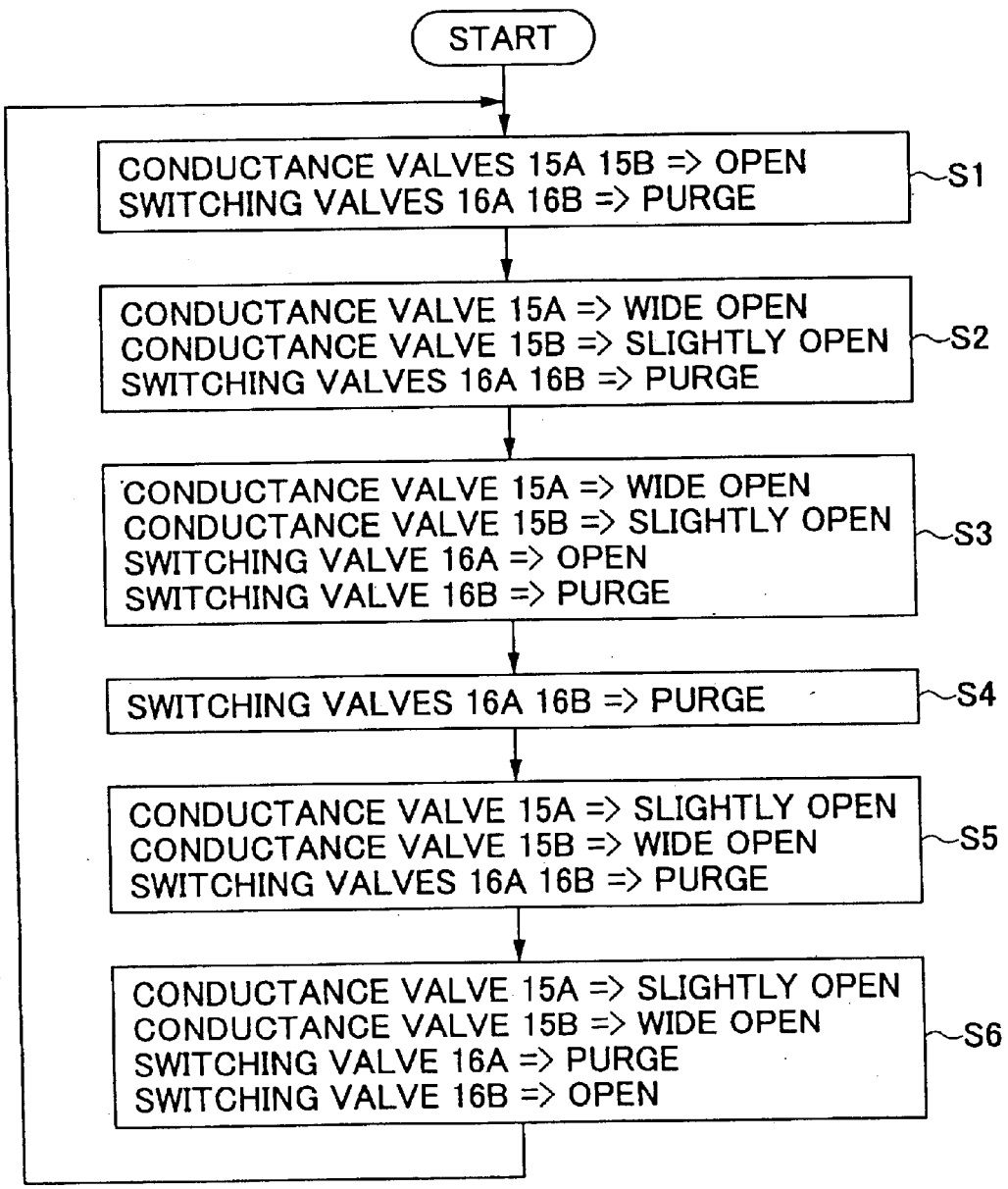
FIG. 5 is a flowchart showing a substrate processing method of the second embodiment of the present invention.
Figure 6:
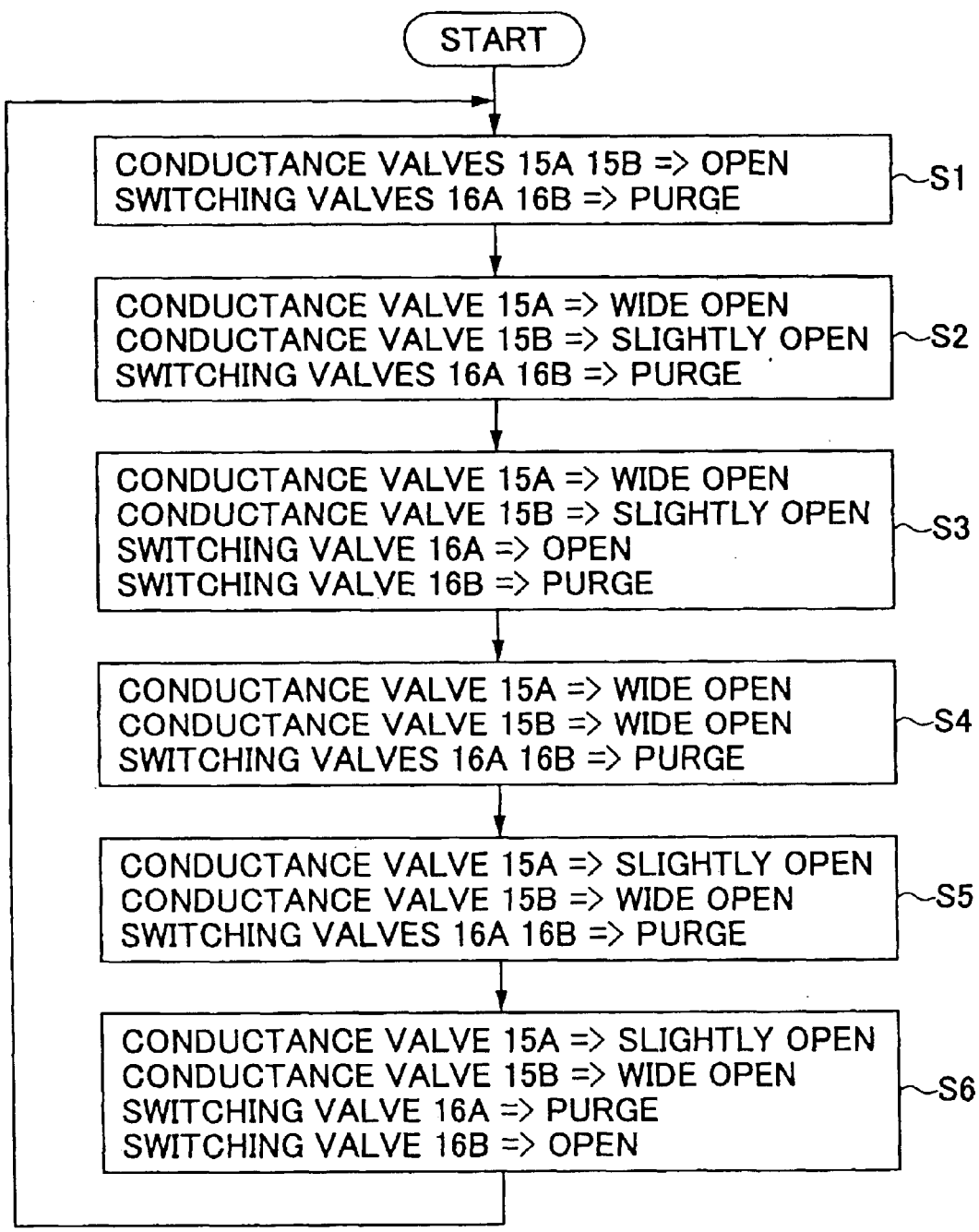
FIG. 6 is a flowchart showing the substrate processing method of a variation of the second embodiment of the present invention.

FIG. 5 is a flowchart that shows processing sequence according to the second embodiment of the present invention, which is carried out under control of the control unit 10A when a ZrO2 film is formed on the substrate-to-be-processed 12 in thickness of about 1 molecule layer per process in the substrate processing apparatus 10 shown by FIGS. 2 and 3.

With reference to FIG 5, in Step 1, the conductance valves 15A and 15B are opened, and the switching valves 16A and 16B are put to a first state, i.e., a purge state wherein the processing gases in the processing gas supply lines 16a and 16b are supplied to the trap 100 through the purge lines 100a and 100b, respectively. As a result, Ar gas in the purge line 23a and Ar gas in the purge line 23b are supplied to the quartz reaction container 110 through the processing gas supply units 13A and 13B, respectively. The Ar purge gases supplied in this manner are discharged to the trap 100 through the exhaust openings 14A and 14B, respectively.

Next, in Step 2, the opening of the conductance valve 15A is widened, and the opening of the conductance valve 15B is narrowed. As the result, the gas flows from the gas supply unit 13A to the exhaust opening 14A in the quartz reaction container 110. Exhaust control that is more reliable than controlling a hot exhaust gas by an interception valve can be performed by controlling the exhaust at the exhaust openings 14A and 14B by adjustment of the conductance of the conductance valves 15A and 15B. Further, since the exhaust is switched continuously, disturbance of gas current in the quartz reaction container 110 is minimized.

Next, in Step 3, the switching valve 16A is switched from the first state to a second state, where the $ZrCl_4$ gas in the processing gas supply line 16a is supplied to the quartz reaction container 110 from the first processing gas supply unit 13A. The ZrCl4 gas supplied in this manner forms a laminar flow along the surface of the substrate-to-be-processed 12, and is discharged from the exhaust opening 14A, as previously explained. Through this process, the ZrCl4 is adsorbed by the surface of the substrate-to-be-processed 12 to form a single-molecule layer. Here, in Step 3, the second switching valve 16B is in the first state, and Ar purge gas in the line 23b is supplied to the quartz reaction container 110 from the second processing gas supply unit 13B. In this manner, the ZrCl4 processing gas supplied from the first processing gas supply unit 13A is prevented from invading the second processing gas supply unit 13B, and the problem that a deposit is produced is avoided.

Next, in Step 4, the switching valve 16A is returned to the first state, and the inside of the quartz reaction container 110 is purged by Ar gas.

At this time, it is also effective to carry out the exhaust from both ends of the substrate-to-be-processed by making both the conductance valves 15A and 15B wide open. Otherwise, it is also possible that this step is not performed at all, that is, the process advances to the next step such that the process time is shortened. In this case, the process sequence becomes like the flowchart shown by FIG. 6.

Next, in Step 5, the opening of the conductance valve 15B is widened, the opening of the conductance valve 15A is narrowed, and the gas flows from the gas supply unit 13B to the exhaust opening 14B in the quartz reaction container 110.

Further, in Step 6, the switching valve 16B is switched to the second state, i.e., an open state, and $H_2O$ in the processing gas supply line 16b is supplied to the quartz reaction container 110 through the processing gas supply unit 13B. The $H_2O$ gas supplied in this manner forms a laminar flow along the surface of the substrate-to-be-processed 12, and is discharged from the exhaust opening 14B. Through this process, the ZrCl4 molecule layer that was previously formed on the surface of the substrate-to-be-processed 12 reacts with the $H_2O$, and a ZrO2 film that is about one-molecule thick is obtained. Here, in Step 6, the first switching valve 16A is in the first state, and the Ar purge gas in the line 23a is supplied to the quartz reaction container 110 from the first processing gas supply unit 13A. Consequently, the $H_2O$ supplied from the second processing gas supply unit 13B is prevented from invading the first processing gas supply unit 13A, and the problem that a deposit is produced is avoided.

After Step 6, the process returns to Step 1, and a next $ZrO_2$ molecule layer on the $ZrO_2$ molecule layer is formed by repeating Step 1 through Step 6. Thus, the ZrO2 film is desired thickness can be formed on the substrate-to-be-processed 12 by repetitively performing Step 1 through Step 6, each cycle forming a one-molecular layer thick $ZrO_2$ film.

Here, during the process of Step 1 through Step 6, the processing gas supply unit 13C is fixed to the first state, i.e., the purge state.

By replacing the ZrCl4 material stored in the material container 20A with $HfCl_4$ or $TaCl_5$, a $HfO_2$ film or a $Ta_2O_5$ film, respectively, can be formed by laminating single-molecule layers according to this embodiment.

In addition, the material to be stored in the material container 20A is not limited to the materials described above, but can be chosen from the group consisting of $ZrCl_4$, $ZrBr_4$, $Zr(I-OC_3H_7)_4$, $Zr(n-OC_4H_9)_4$, $Zr(t-OC_4H_9)_4$, Zr(AcAc)$_4$, (DPM)$_4$, Zr(O-iPr) (DPM)$_3$, Zr(HFA)$_4$, Zr(BH$_4$)$_4$, Zr[N(CH$_3$)$_2$]$_4$, and Zr[N(C$_2$H$_5$)$_2$]$_4$, the group consisting of (C$_2$H$_5$)$_2$AlN$_3$, (C$_2$H$_5$)$_2$AlBr, (C$_2$H$_5$)$_2$AlCl, (C$_2$H$_5$)$_2$AlI, (I—C$_4$H$_9$)AlH, (CH$_3$)$_2$AlNH$_2$, (CH$_3$)$_2$AlCl, (CH$_3$)$_2$AlH, (CH$_3$)$_2$AlN:N(CH$_3$)$_2$C$_2$H$_5$, AlH$_3$:N(CH$_3$)$_2$ C$_2$H$_5$, Al(C$_2$H$_5$)Cl$_2$, Al(CH$_3$)Cl$_2$, Al(C$_2$H$_5$)$_3$, Al(I—C$_4$H$_9$), Al(I—OC$_4$H$_9$)$_3$, AlCl$_3$, Al(CH$_3$)$_3$, AlH$_3$:N(CH$_3$)$_3$, Al(AcAc)$_3$ and Al(DPM)$_3$, Al(HFA)$_3$, Al(OC$_2$H$_5$)$_3$, Al(I—C$_4$H$_9$)$_3$, Al(I—OC$_3$H$_7$)$_3$, Al(OCH$_3$)$_3$, Al(n-OC$_4$H$_9$)$_3$, Al(n-OC$_3$H$_7$)$_3$, Al(sec-OC$_4$H$_9$)$_3$, Al(t-OC$_4$H$_9$)$_3$ and AlBr$_3$, and the group consisting of Y(AcAc)$_3$, Y(DPM)$_3$, Y(O-iPr)(DPM)$_2$, Y(HFA)$_3$, Cp$_3$Y, otherwise, from the group consisting of HfCl$_4$, HfBr$_4$, Hf(AcAc)$_4$, Hf[N(C$_2$H$_5$)$_2$]$_4$, Hf[N(CH$_3$)$_2$]$_4$, Hf(DPM)$_4$, Hf(O-iPr)(DPM)$_3$, and Hf(HFA)$_4$, the group consisting of TiCl$_4$, TiBr$_4$, TiI$_4$, Ti(I—OCH$_3$)$_4$, Ti(OC$_2$H$_5$)$_4$, Ti(I—OC$_3$H$_7$)$_4$, Ti(n-OC$_3$H$_7$)$_4$, Ti(n-OC$_4$H$_9$)$_4$, Ti(AcAc)$_4$, Ti(AcAc)$_2$Cl$_2$, Ti(DPM)$_4$, Ti(DPM)$_2$Cl$_2$, Ti(O-iPr)(DPM)$_3$, and Ti(HFA)$_2$Cl$_2$, and the group consisting of LaBr$_3$, LaI$_3$, La(OCH$_3$)$_3$, La(OC$_2$H$_5$)$_3$, La(I—OC$_3$H$_7$)$_2$, Cp$_3$La, MeCp$_3$La, La(DPM)$_3$, La(HFA)$_3$, La(AcAc)$_3$, Cp(C8H8)Ti, Cp$_2$Ti[N(CH$_3$)$_2$]$_2$, CP$_2$TiCl$_2$, (C$_2$H$_5$)Ti(N$_3$)$_2$, Ti[N(C$_2$H$_5$)$_2$]$_4$, and Ti[N(CH$_3$)$_2$]$_4$. Further, the second processing gas supplied through the line 16b can be chosen from the group that consists of oxygen radical atoms, oxygen radical molecules, O$_3$, O$_2$, N$_2$O, NO, NO$_2$, H$_2$O$_2$, H$_2$O and D$_2$O. Especially as the materials, Al(CH$_3$)$_3$, AlCl$_3$, Zr[N(C$_2$H$_5$)$_2$]$_4$, Zr[N(CH$_3$)$_2$]$_4$, Hf[N(C$_2$H$_5$)$_2$]$_4$, ZrCl$_4$, HfCl$_4$ TiCl$_4$, Ti[N(C$_2$H$_5$)$_2$]$_4$, Ti[N(CH$_3$)$_2$]$_4$, etc. are effective in atomic layer growth.

[The Third Embodiment]

Figure 7:
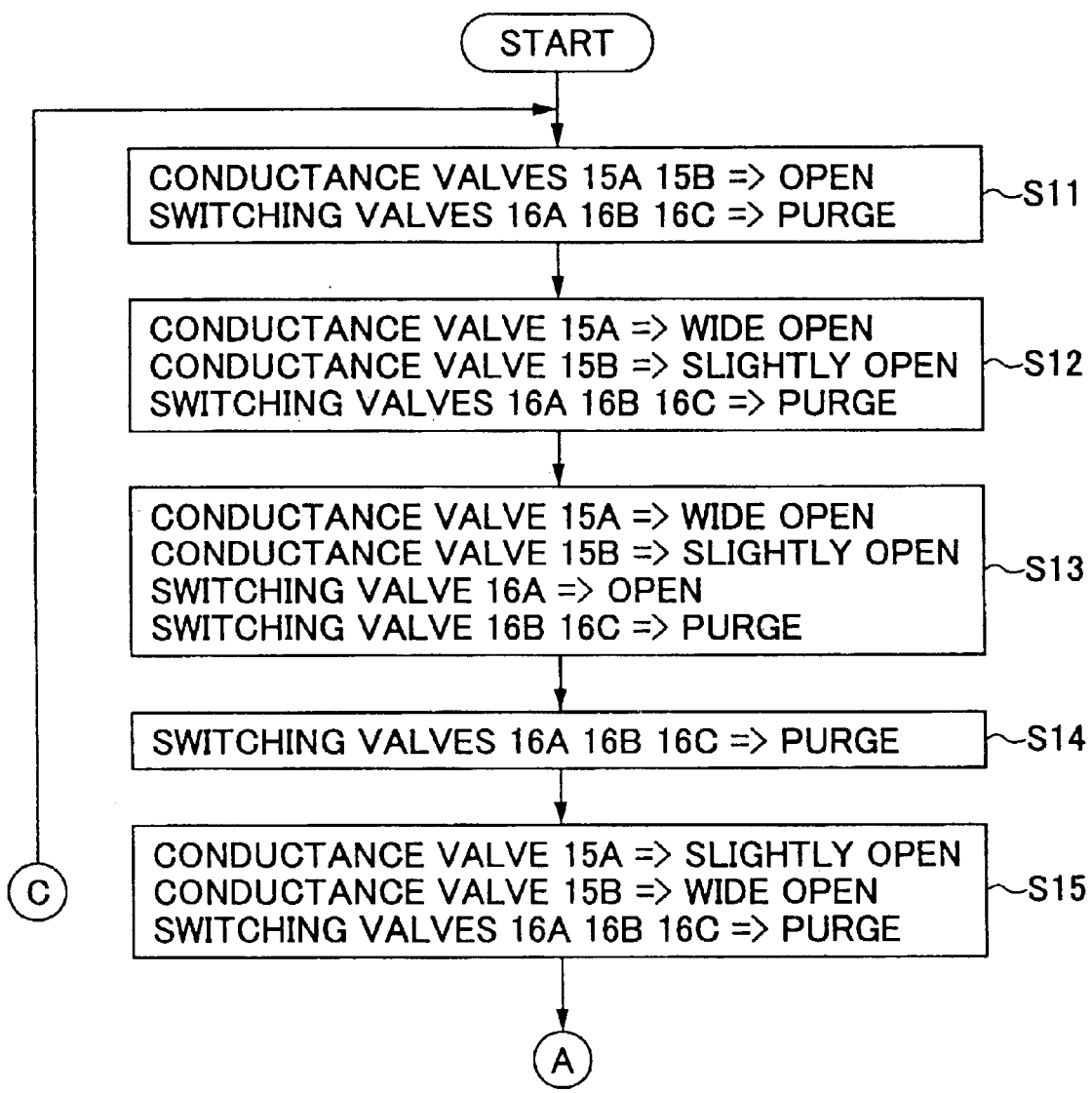
FIGS. 7 through 9 are flowcharts showing the substrate processing method according to the third embodiment of the present invention.
Figure 8:
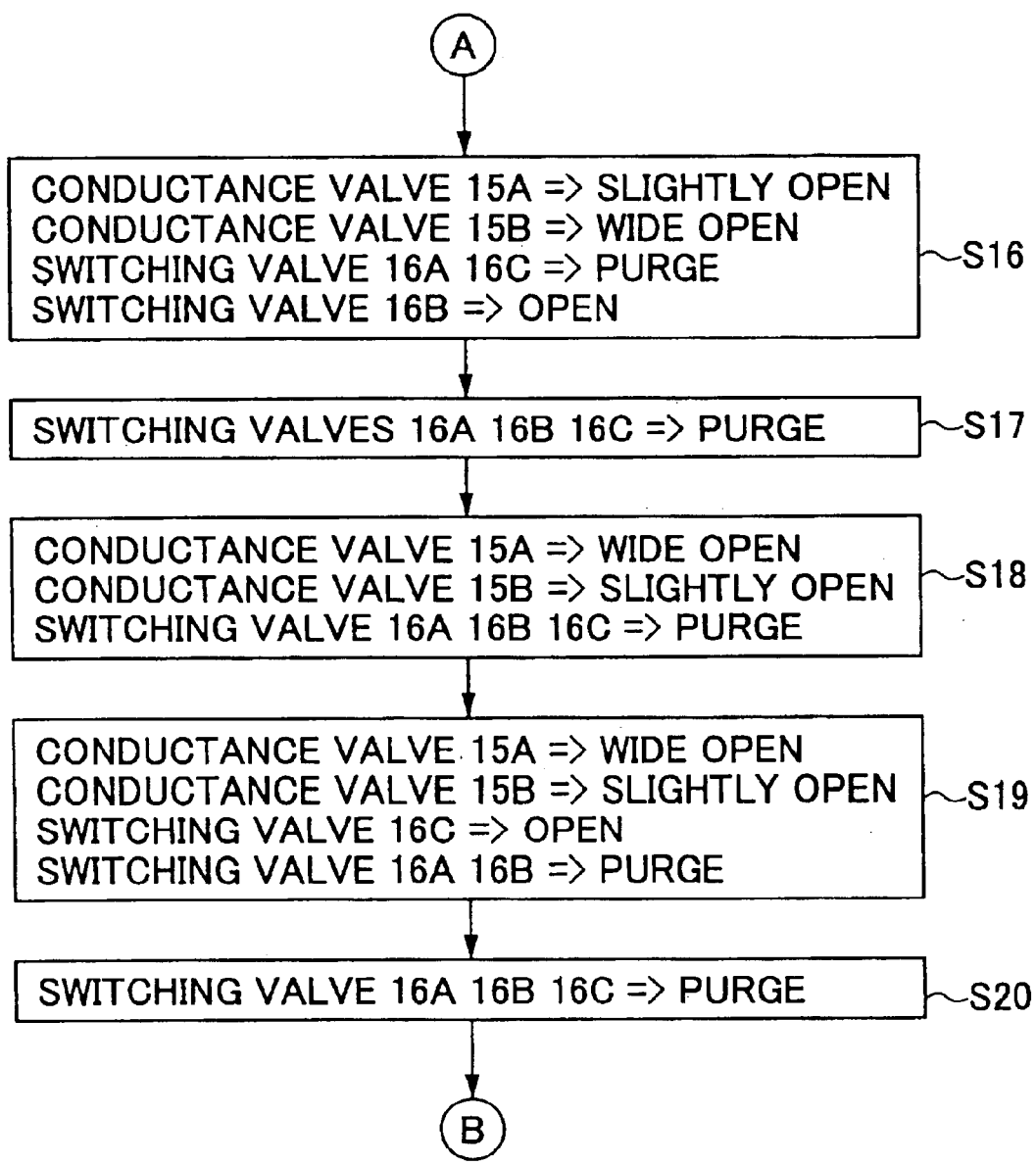
Figure 9:
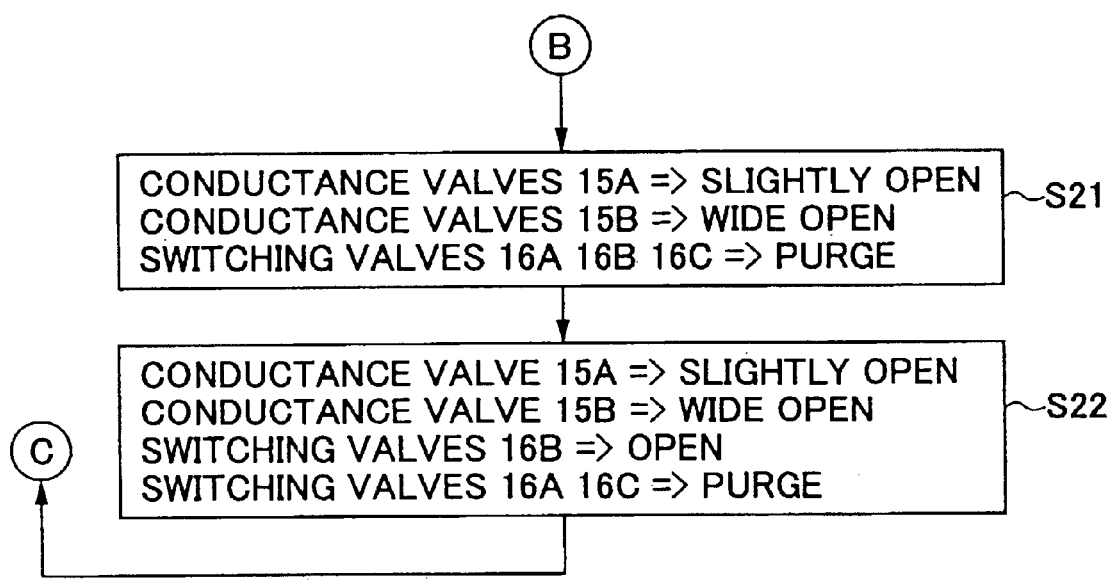

FIGS. 7 through 9 are flowcharts that show processing sequence according to the third embodiment of the present invention, which is carried out under control of the control unit 10A when a ZrSiO$_4$ film is formed on the substrate-to-be-processed 12 in thickness of about 1 molecule layer per process in the substrate processing apparatus 10 shown by FIGS. 2 and 3.

First, with reference to FIG. 7, in Step 11, the conductance valves 15A and 15B are opened, and the switching valves 16A through 16C are set to the first state, i.e., the purge state so that the processing gases in the processing gas supply lines 16a and 16c are supplied to the trap 100 through the purge line 100a, and the processing gas in the processing gas supply line 16b is supplied to the trap 100 through the purge line 100b. As the result, Ar gases in the purge lines 23a through 23c are supplied to the quartz reaction container 110 through the processing gas supply units 13A through 13C, respectively. The Ar purge gases supplied in this way are discharged to the trap 100 from the exhaust openings 14A and 14B, as described above.

Next, in Step 12, the opening of the conductance valve 15A is widened, and the opening of the conductance valve 15B is narrowed. Consequently, in the quartz reaction container 110, the gas flows from the gas supply units 13A and 13C to the exhaust opening 14A.

Next, in Step 13, the switching valve 16A is switched from the first state to the second state, and the ZrCl4 gas in the processing gas supply line 16a is supplied to the quartz reaction container 110 from the first processing gas supply unit 13A. The ZrCl4 gas supplied in this way forms a laminar flow along the surface of the substrate-to-be-processed 12, and is discharged from the exhaust opening 14A, as previously explained. Through this process, the ZrCl$_4$ is adsorbed by the surface of the substrate-to-be-processed 12 to form a single-molecule layer. In Step 13, the second and the third switching valves 16B and 16C are in the first state, and the Ar purge gases in the purge lines 23b and 23c are supplied to the quartz reaction container 110 from the processing gas supply units 13B and 13C, respectively. Consequently, the ZrCl4 processing gas supplied from the first processing gas supply unit 13A is prevented from invading the second processing gas supply unit 13B, and the problem that a deposit is produced is avoided.

Next, in Step 14, the switching valve 16A is returned to the first state, and the inside of the quartz reaction container 110 is purged by the Ar gas.

Next, in Step 15, the opening of the conductance valve 15B is widened, the opening of the conductance valve 15A is narrowed, and the gas flows from the gas supply unit 13B to the exhaust opening 14B, and is provided to the quartz reaction container 110.

Furthermore, in Step 16, the switching valve 16B is switched to the second state, i.e., the open state, and H$_2$O in the processing gas supply line 16b is supplied to the quartz reaction container 110 through the processing gas supply unit 13B. The H$_2$O gas supplied in this way forms a laminar flow along the surface of the substrate-to-be-processed 12, and is discharged from the exhaust opening 14B, as explained previously. According to this process, the ZrCl$_4$ molecule layer that was previously adsorbed by the surface of the substrate-to-be-processed 12 reacts with the H$_2$O, and the ZrO$_2$ film consisting of a single-molecule layer is formed. In Step 16, the switching valves 16A and 16C are in the first state, and the Ar purge gases in the line 23a and 23c are supplied to the quartz reaction container 110 from the processing gas supply units 13A and 13C. Consequently, H$_2$O supplied from the second processing gas supply unit 13B is prevented from invading the processing gas supply units 13A and 13C, and the problem that a deposit is produced is avoided.

In Step 17 that follows Step 16, the conductance valves 15A and 15B are opened, and the switching valves 16A through 16C are put to the first state. As the result, the Ar gases in the purge lines 23a through 23c are supplied to the quartz reaction container 110 through the processing gas supply units 13A through 13C, respectively. The Ar purge gases supplied in this way are discharge to the trap 100 through the exhaust openings 14A and 14B, respectively, Next, in Step 18, the opening of the conductance valve 15A is widened, and the opening of the conductance valve 15B is narrowed. Consequently, in the quartz reaction container 110, the gas flows from the gas supply units 13A and 13C to the exhaust opening 14A.

Next, in Step 19, the switching valve 16C is switched from the first state to the second state, and SiCl4 gas in the processing gas supply line 16c is supplied to the quartz reaction container 110 through the third processing gas supply unit 13C. As explained previously, the SiCl4 gas supplied in this way forms a laminar flow along the surface of the substrate-to-be-processed 12, and is discharged from the exhaust opening 14A. Through this process, a single-molecule layer SiCl4 is absorbed by the ZrO2 molecule layer previously formed on the surface of the substrate-to-be-processed 12. In Step 19, the second and the third switching valves 16A and 16B are in the first state, and the Ar purge gases in the purge lines 23a and 23b are supplied to the quartz reaction container 110 through the processing gas supply units 13A and 13B, respectively. Consequently, the SiCl4 processing gas supplied from the third processing gas supply unit 13C is prevented from invading the second processing gas supply unit 13B, and the problem that a deposit is produced is avoided.

Next, in Step 20, the switching valve 16A is returned to the first state, and the inside of the quartz reaction container 110 is purged by the Ar gas.

Next, in Step 21, the opening of the conductance valve 15B is widened, the opening of the conductance valve 15A is narrowed, and the gas flows from the gas supply unit 13B to the exhaust opening 14B, and is provided to the quartz reaction container 110.

Furthermore, in Step 22, the switching valve 16B is switched to the second state, i.e., the open state, and $H_2O$ in the processing gas supply line 16b is supplied to the reaction container 110 through the processing gas supply unit 13B. As explained previously, the $H_2O$ gas supplied in this way forms a laminar flow along the surface of the substrate-to-be-processed 12, and is discharged from the exhaust opening 14B. Through this process, the $SiCl_4$ molecule layer that was previously adsorbed on the surface of the substrate-to-be-processed 12 reacts with the $H_2O$, and a $SiO_2$ film in single-molecule layer is formed on the ZrO2 molecule layer. Here, in Step 22, the switching valves 16A and 16C are in the first state, and the Ar purge gases in the purge lines 23a and 23c are supplied to the quartz reaction container 110 from the processing gas supply units 13A and 13C, respectively. Consequently, the $H_2O$ supplied from the second processing gas supply unit 13B is prevented from invading the processing gas supply units 13A and 13C, and the problem that a deposit is produced is avoided.

By repeating Step 11 through Step 22, a high dielectric film of a configuration expressed by ZrSiO4 as a whole is formed by the alternated layers of ZrO2 molecules and SiO2 molecules on the substrate-to-be-processed 12.

Figure 10:
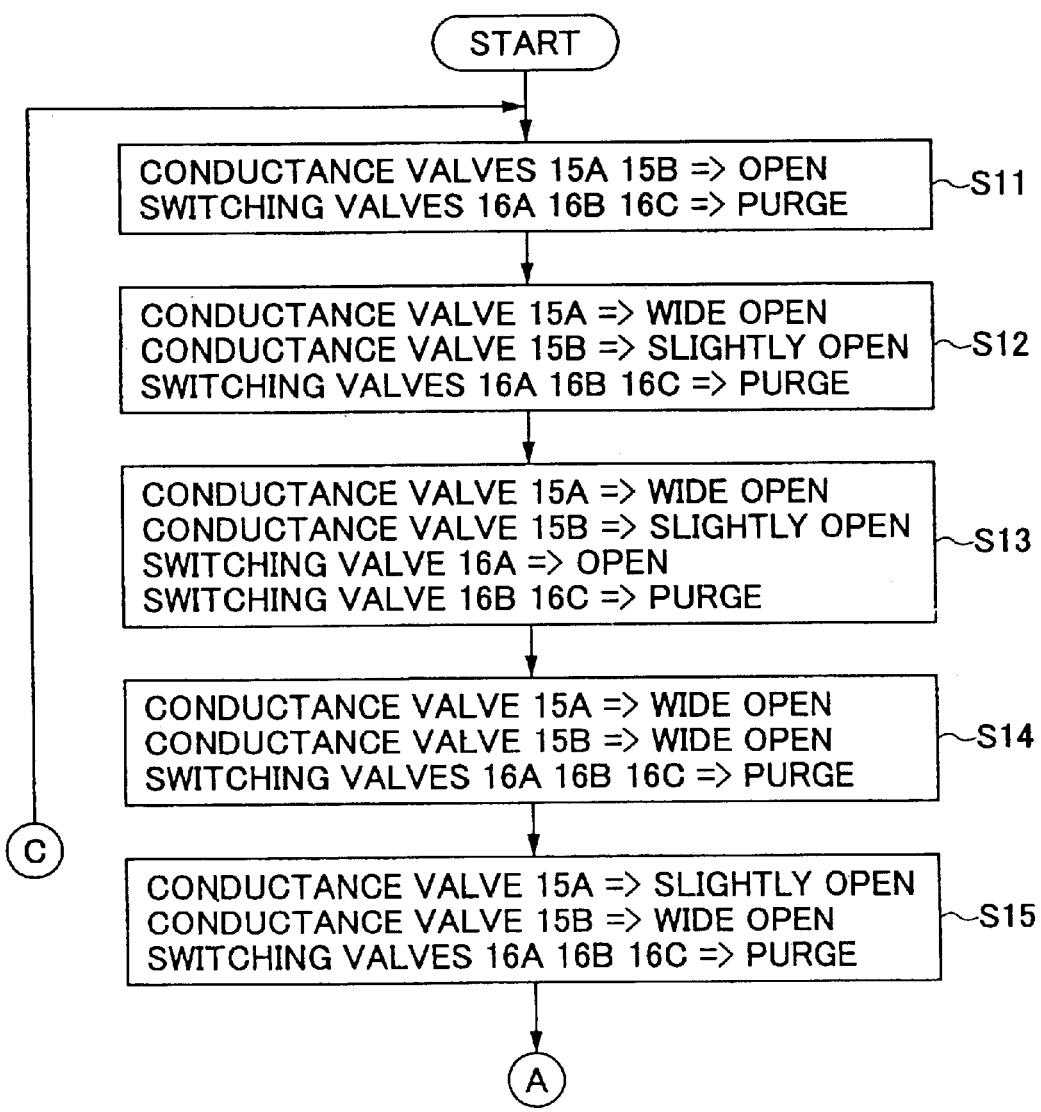
FIGS. 10 through 12 are flowcharts showing another example of the substrate processing method according to the third embodiment of the present invention.
Figure 11:
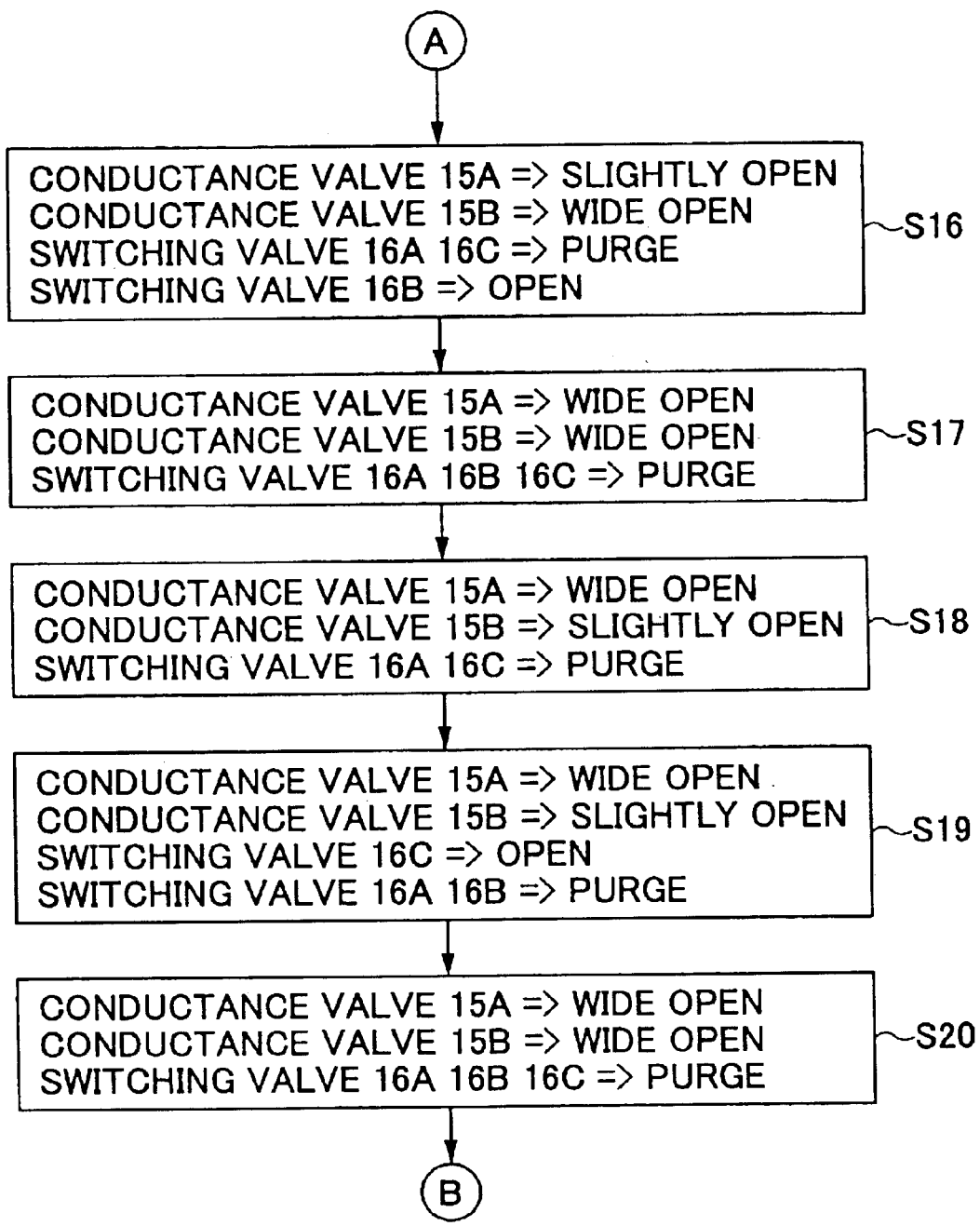
Figure 12:
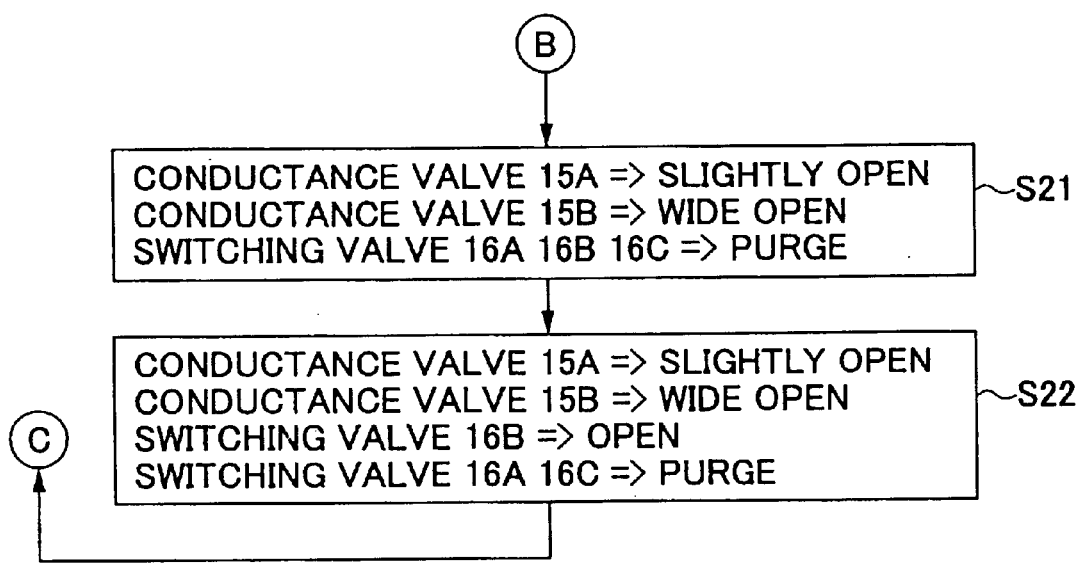

Further, by changing a ratio of the number of single-molecule layers of ZrO2 to the number of single-molecule layers of SiO2, composition of the dielectric film can be adjusted in the direction of film thickness. For example, it is possible to control the composition such that the SiO2 contents are higher than the ZrO2 contents in a lower layer of the dielectric film, and ZrO2 contents are higher than the SiO2 contents in an upper layer. In Step 14, Step 17, and Step 20, the openings of the conductance valves 15A and 15B may be set as the maximum. In this case, exhaust is performed on the both ends of the substrate-to-be-processed, and gas purging becomes more efficient. Flowcharts corresponding to the processing sequence in this case are shown by FIGS. 10 through 12.

Here, the material stored in the material container 20C is not limited to the materials described above, but rather may be selected from a group consisting of $H_2Si[N(CH_3)_2]_2$, $(C_2H_5)_2SiH_2$, $(CH_3)_2SiCl_2$, $(CH_3)_2Si(OC_2H_5)_2$, $(CH_3)_2Si(OCH_3)_2$, $(CH_3)_2SiH_2$, $C_2H_5Si(OC_2H_5)_3$, $(CH_3)_3SiSi(CH_3)_3$, $HN[Si(CH_3)_3]_2$, $(CH_3)(C_6H_5)SiCl_2$, $CH_3SiH_3$, $CH_3SiCl_3$, $CH_3Si(OC_2H_5)_3$, $CH_3Si(OCH_3)_3$, $C_6H_5Si(Cl)(OC_2H_5)_2$, $C_6H_5Si(OC_2H_5)_3$, $(C_2H_5)_4Si$, $Si[N(CH_3)_2]_4$, $Si(CH_3)_4$, $Si(C_2H_5)_3H$, $(C_2H_5)_3SiN_3$, $(CH_3)_3SiCl$, $(CH_3)_3SiOC_2H_5$, $(CH_3)_3SiOCH_3$, $(CH_3)_3SiH$, $(CH_3)_3SiN_3$, $(CH_3)_3(C_2H_3)Si$, $SiH[N(CH_3)_2]_3$, $SiH[N(CH_3)_2]_3$, $Si(CH_3COO)_4$, $Si(OCH_3)_4$, $Si(OC_2H_5)_4$, $Si(I—OC_3H_7)_4$, $Si(t-OC_4H_9)_4$, $Si(n-OC_4H_9)_4$, $Si(OC_2H_5)_3F$, $HSi(OC_2H_5)_3$, $Si(I—OC_3H_7)_3F$, $Si(OCH_3)_3F$, $HSi(OCH_3)_3$, $H_2SiCl_2$, $Si_2Cl_6$, $Si_2F_6$, $SiF_4$, $SiCl_4$, $SiBr_4$, $HSiCl_3$, $SiCl_3F$, $Si_3H_8$, $SiH_2Cl_2$, $Si(C_2H_5)_2Cl_2$, or from a group consisting of $(C_2H_5)_2AlN_3$, $(C_2H_5)_2AlBr$, $(C_2H_5)_2AlCl$, $(C_2H_5)_2AlI$, $(I—C_4H_9)AlH$, $(CH_3)_2AlNH_2$, $(CH_3)_2AlCl$, $(CH_3)_2AlH$, $(CH_3)_2AlH:N(CH_3)_2C_2H_5$, $AlH_3:N(CH_3)_2C_2H_5$, $Al(C_2H_5)Cl_2$, $Al(CH_3)Cl_2$, $Al(C_2H_5)_3$, $Al(I—C_4H_9)Al$, $Al(I—OC_4H_9)_3AlCl_3$, $Al(CH_3)_3$, $AlH_3:N(CH_3)_3$, $Al(AcAc)_3$, $Al(DPM)_3$, $Al(HFA)_3$, $Al(OC_2H_5)_3$, $Al(I—C_4H_9)_3$, $Al(I—OC_3H_7)_8$, $Al(OCH_3)_3$, $Al(n-OC_4H_9)_3$, $Al(n-OC_3H_7)_3$, $Al(sec-OC_4H_9)_3$, $Al(t-OC_4H_9)_3$, and $AlBr_3$.

[The Fourth Embodiment]

With the substrate processing apparatus 10 shown by FIGS. 2 and 3, the $ZrCl_4$ gas is supplied from the material container 20A to the material supply line 16a and the switching valve 16A. In normal temperature, ZrCl4 is solid and needs a temperature of about 200-degrees C. for evaporation. This requires that the whole material supply line 16a including the switching valve 16A be held at a temperature higher than 200 degrees C., which means that the switching valve 16A should be able to bear a temperature higher than 200 degrees C., in practice, higher than 250 degrees C. Further, as explained with reference to FIGS. 5 through 9, with the substrate processing apparatus 10 shown by FIGS. 2 and 3, the switching valves 16A through 16C are frequently driven (controlled) for the deposition of every single-molecule layer. For this reason, the problem of wear and tear of the switching valves arises.

Figure 13A:
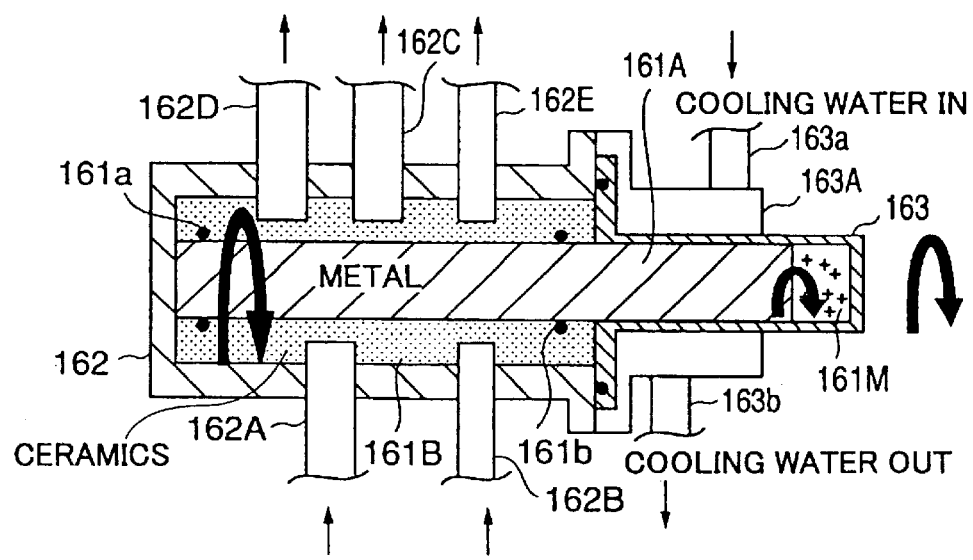
FIGS. 13A and 13B show a configuration of a switching valve according to the fourth embodiment of the present invention.
Figure 13B:
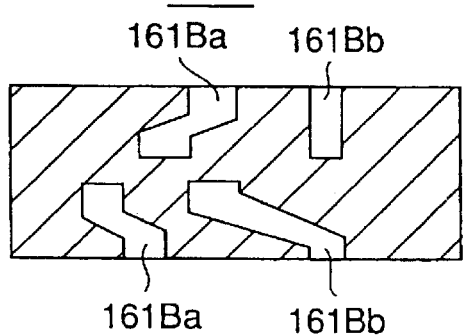

Here, FIGS. 13A and 13B show a configuration of a switching valve 160 according to the fourth embodiment of the present invention, which is used as the switching valve 16A in the substrate processing apparatus 10 of FIGS. 2 and 3. The switching valve 160 of FIGS. 13A and 13B can also be used as the switching valves 16B and 16C in the substrate processing apparatus 10 of FIGS. 2 and 3.

With reference to FIG. 13A, the switching valve 160 includes a metal driving axis 161A, a ceramic valve element 161B in the shape of a cylinder, surrounding the metal driving axis 161A, a container 162 that holds the ceramic valve element 161B rotation-free, and a cap unit 163 that seals the metal driving axis 161A in collaboration with the container 162. The cap unit 163 further includes a water-cooling jacket 163A equipped with a cooling-water entrance 163a and a cooling-water exit 163b. The ceramic valve element 161B is fixed to the metal driving axis 161A through sealing rings 161a and 161b. The tip part of the metal driving axis 161A is covered by the cap unit 163, and is provided with a magnet 161M of a heat-resistant samarium-cobalt system. The magnet 161M is magnetically connected to an external electromagnetic driving mechanism that rotates the magnet 161M.

Further, the container 162 includes a first gas entrance 162A corresponding to the processing gas supply line 16a, a second gas entrance 162B corresponding to the purge gas line 23a, a first gas exit 162C connected to the processing gas supply unit 16A, and a second and a third gas exits 162D and 162E connected to the purge line 100a.

FIG. 13B shows the details of the ceramic valve element 161B of FIG. 13A.

With reference to FIG. 13B, on the perimeter of the valve element 161B, first and second slots 161Ba and 161Bb are provided. When the valve element 161B turns, the gas entrances 162A and 162B are selectively connected to the gas exits 162C–162E through the slots 161Ba and 161Bb.

For example, when the switching valve 16A is in the first state, the gas entrance 162B connected to the purge line 23a is connected to the gas exit 162C through the slots 161Bb, and the Ar gas in the purge line 23a is supplied to the quartz reaction container 110 through the processing gas supply unit 13A. At the same time, in this state, the gas entrance 162A connected to the processing gas supply line 16a is connected to the gas exit 162D through the slots 161Ba, and the processing gas in the processing gas supply line 16a is drawn away to the purge line 100a through the gas exit 162D.

In contrast, when the switching valve 16B is in the second state, the valve element 161B is turned such that the gas entrance 162B is connected to the gas exit 162E through the slots 161Bb, as the result of which, the Ar gas in the purge line 23a is thrown away to the purge line 100a through the gas exit 162E. On the other hand, the gas entrance 162A is connected to the gas exit 162C through the slots 161Ba, and the processing gas is supplied to the quartz reaction container 110 from the gas exit 162C through the processing gas supply unit 13A.

The switching valve 160 having the configuration described as above can satisfactorily withstand switching operations repeatedly performed at the temperature of 250 degree C. Further, even when the switching valve 160 intercepts the supply of the processing gas to the quartz reaction container 110, the flow of the processing gas is only switched to the purge line 100a. In this manner, the pressure and flux of the material gas, such as ZrCl4 gas, from the material container 20A do not change greatly.

As previously explained, the switching valve 160 is applicable not only to the switching valve 16A of FIG. 2, but also to other switching valves 16B and 16C.

[The Fifth Embodiment]

Figure 14:
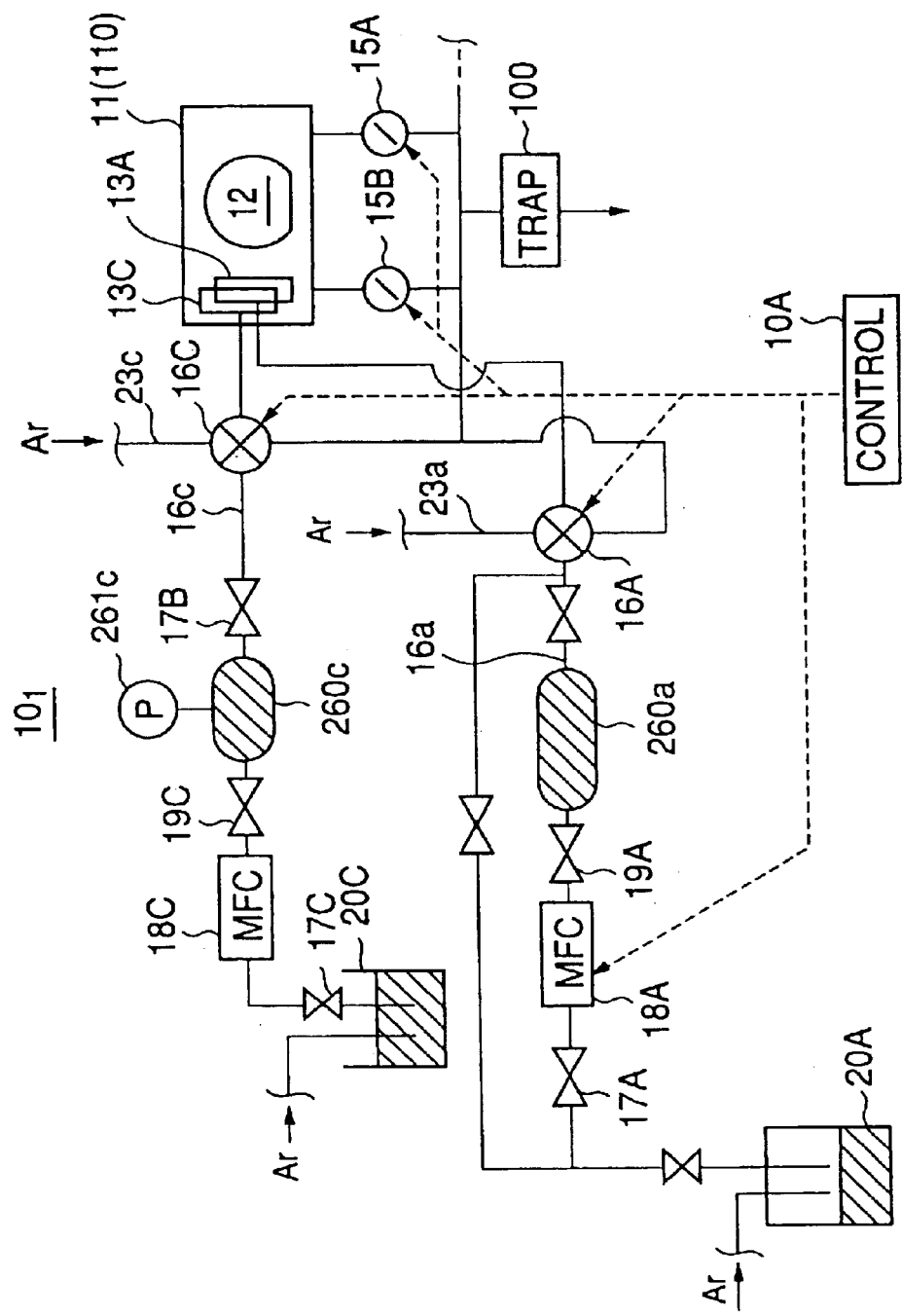
FIG. 14 shows a configuration of the substrate processing apparatus according to the fifth embodiment of the present invention.

FIG. 14 shows a configuration of the substrate processing apparatus $10_1$ according to the fifth embodiment of the present invention. In FIG. 14, the same reference numbers are given to the same portions explained previously, and explanations thereof are not repeated. Further, for the simplicity purposes, illustrations of portions that are not directly related to the fifth embodiment among the portions explained previously in FIGS. 2 and 3 are omitted.

With reference to FIG. 14, processing gas storing units 260a and 260c having an increased capacity locally are provided at a suitable point in the processing gas supply lines 16a and 16c, respectively, and a processing gas is stored in the processing gas storing units in the fifth embodiment. By providing the processing gas storing units 260a and 260b, supply of a processing gas can be stabilized even if a change of the conductance arises in the processing gas supply lines 16a and 16c due to frequent switching of the processing gases, as previously explained in reference to FIGS. 5 through 9.

In reference to the configuration, especially, of the processing gas supply line 16a shown by FIG. 14, the control unit 10A controls such that the mass flux controller 18A prepared in the processing gas supply line 16a is controlled in synch with switching control of the switching valves 16A through 16C. By this configuration, the supply flux change of the processing gas in the processing gas supply line 16a is compensated for, and the supply of the processing gas through the processing gas supply line 16a is stabilized.

Furthermore, by the configuration shown in FIG. 14, a pressure gauge 261c is prepared in the processing gas supply line 16c for the processing gas storing unit 260c, and the pressure of the processing gas storing unit 260c is constantly maintained. This configuration effectively compensates for fluctuations in the conductance, which occur in the processing gas supply line 16c.

In the configuration of FIG. 14, the mass flux controller 18C prepared in the processing gas supply line 16c can be controlled by the control unit 10A, like the mass flux controller 18A of the processing gas supply line 16a. Further, in the processing gas supply line 16a, a pressure gauge may be provided to the processing gas storing unit 260a. Furthermore, the same configuration can also be provided to the processing gas supply line 16b.

[The Sixth Embodiment]

Figure 15:
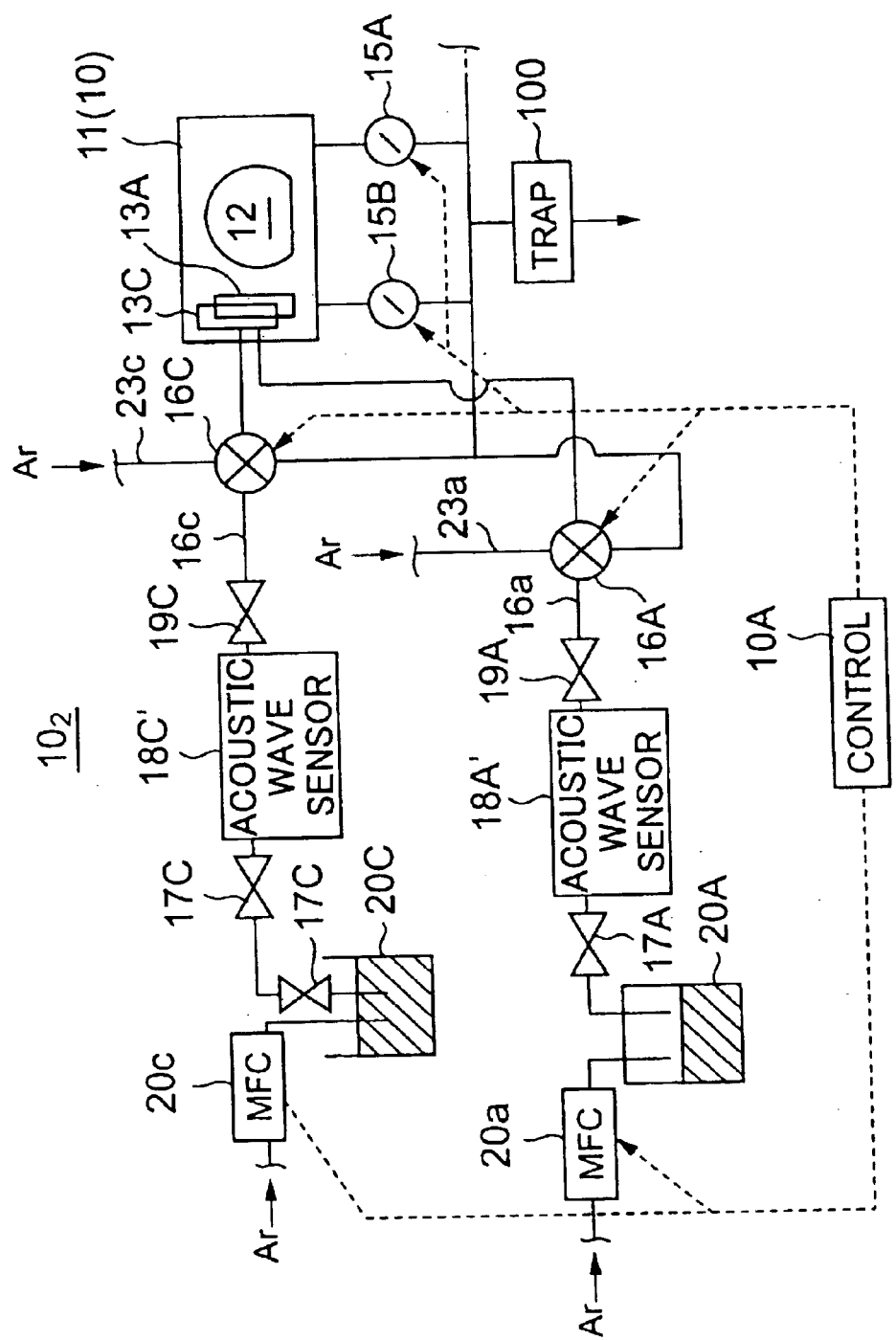
FIG. 15 shows a configuration of the substrate processing apparatus according to the sixth embodiment of the present invention.

FIG. 15 shows a configuration of the substrate processing apparatus $10_2$ according to the sixth embodiment of the present invention. Here, in FIG. 15, the same reference numbers are given to the same portions previously explained, and explanations thereof are not repeated. Further, for the simplicity purposes, illustration of a portion that is not directly related to this embodiment among the portions explained previously in FIGS. 2 and 3 is omitted.

With reference to FIG. 15, mass flux controllers 20a and 20c are provided to the lines that supply carrier gases to the material containers 20A and 20C, respectively, in this embodiment. Further, the mass flux controllers 20a and 20c are controlled by the control unit 10A in synch with control of the switching valves 16A through 16C and the conductance valves 15A and 15B.

More specifically, the mass flux controller 20a is controlled such that the flux is increased only when the switching valve 16 supplies the processing gas in the processing gas supply line 16a to the processing gas supply unit 13A. Similarly, the mass flux controller 20c is controlled such that the flux is increased only when the switching valve 16C supplies the processing gas in the processing gas supply line 16c to the processing gas supply unit 13C. By controlling the mass flux controllers 20a and 20c in synch with the control of the switching valves 16A and 16C, an amount of the processing gas that otherwise would be wasted in the case wherein the gas is not supplied to the quartz reaction container 110 is minimized. Accordingly, the load of an abatement device connected to the trap 100 is mitigated.

In this case, it is effective to provide acoustic wave sensors 18C' and 18A' as shown in FIG. 15, instead of the mass flux controllers 18C and 18A shown in FIG. 14, where the material density of an Ar carrier is measured, and the measurement result is fed back to the mass flux controllers 20a and 20c, respectively.

[The Seventh Embodiment]

Figure 16:
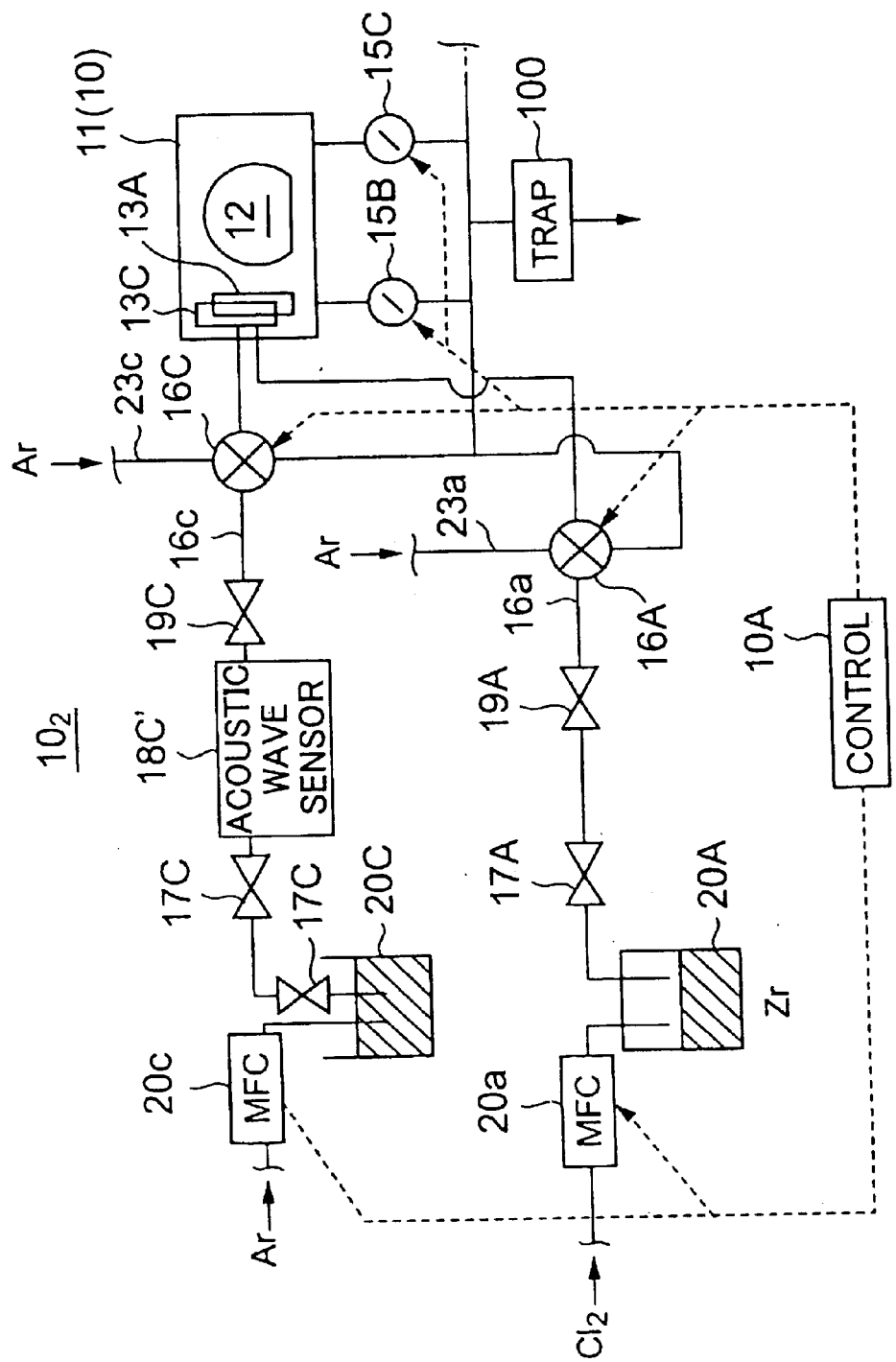
FIG. 16 shows a configuration of the substrate processing apparatus according to the seventh embodiment of the present invention.

FIG. 16 shows a configuration of the substrate processing apparatus $10_2$ according to the seventh embodiment of the present invention. In FIG. 16, the same reference numbers are given to the same portions previously explained, and explanations thereof are not repeated. Further, for simplicity purposes, illustration of the portion that is not directly related to this embodiment among the portions previously explained in FIGS. 2 and 3 are omitted.

With reference to FIG. 16, unlike the previous embodiment, the material container 20A stores metal Zr, instead of the ZrCl2, as shown in FIG. 16. The ZrCl2 gas is generated by supplying a Cl2 gas as carrier gas to the metal Zr. At this occasion, the flux of the Cl2 carrier gas is increased by the control unit 10A, like the previous embodiment, only when the ZrCl2 gas in the processing gas supply line 16a is supplied to the processing container 11.

In this manner, according to this embodiment, a chloride processing gas, such as ZrCl2, can also be supplied through the processing gas supply unit 13A to the quartz reaction container 110 in the processing container 11.

[The Eighth Embodiment]

Figure 17:
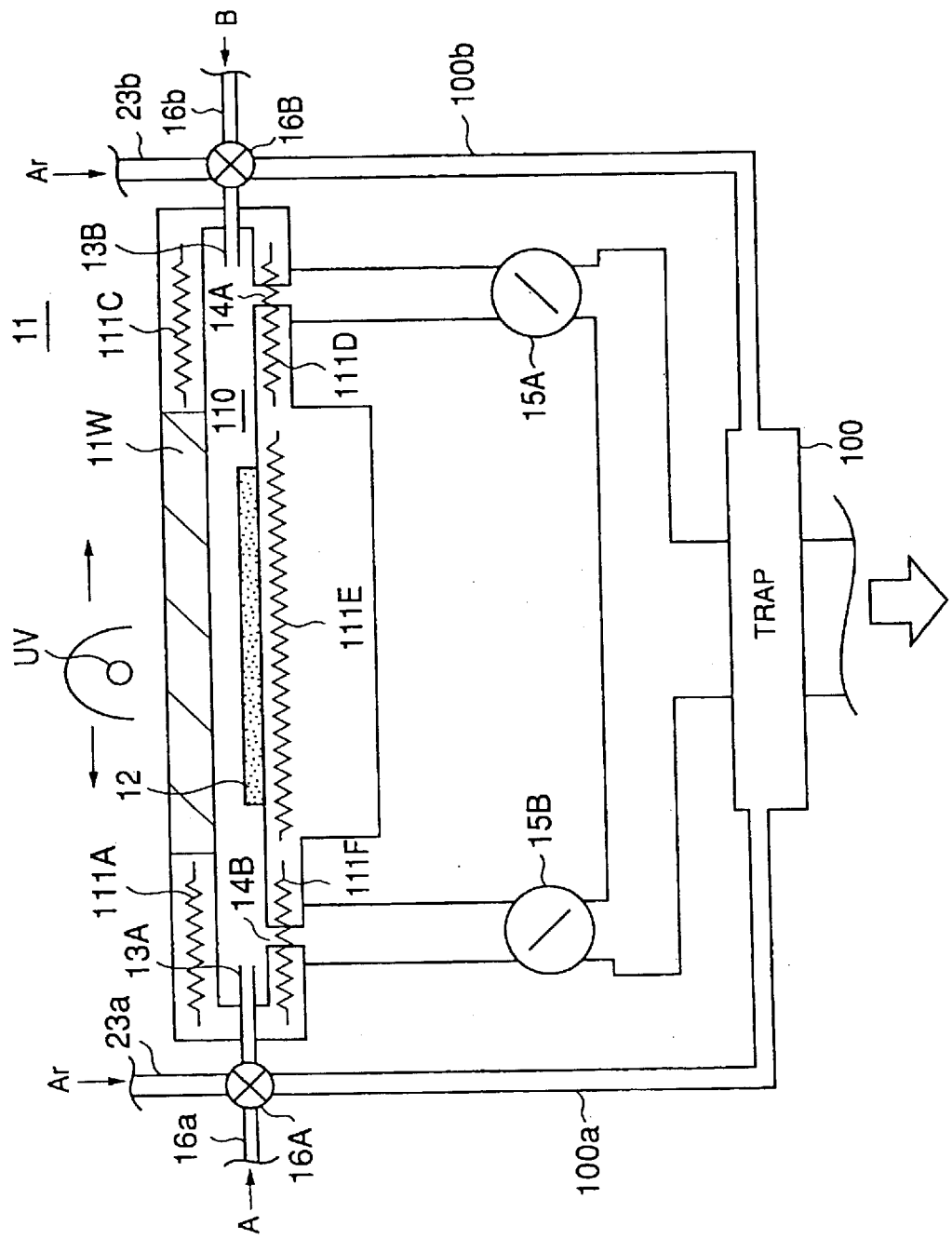
FIG. 17 shows a configuration of the substrate processing apparatus according to the eighth embodiment of the present invention.

FIG. 17 shows a configuration of a processing container 11A according to the eighth embodiment of the present invention. In FIG. 17, the same reference numbers are given to the same portions previously explained, and explanations thereof are not repeated.

With reference to FIG. 17, a quartz window 11W is prepared in this embodiment in place of the heater 111B provided in the embodiment of FIG. 3 at the position that counters the substrate-to-be-processed 12 in the processing container 11. Furthermore, an ultraviolet source UV, which is movable along the quartz window 11W, is provided.

With this configuration, film formation on the surface of the substrate-to-be-processed 12 is promoted by irradiating an ultraviolet ray to the surface of the substrate-to-be-processed 12 from the ultraviolet source UV through the quartz window 11W. The amount of exposure to the surface of the substrate-to-be-processed 12 is made uniform by moving the ultraviolet source UV along the quartz window 11W. Further, it becomes possible to uniformly heat the substrate-to-be-processed by providing an infrared lamp, in addition to the ultraviolet source. This configuration is especially effective when annealing the formed film at the temperature of 600–1000 degrees C. for a short period of time, or when performing heat treatment after film formation, while irradiating the ultraviolet rays. The process such as above is effective in removing impurities, such as hydrocarbon, halogen, and the like, from the surface of the substrate-to-be-processed.

[The Ninth Embodiment]

FIGS. 18A through 18D are plan views showing various variations of the processing container 11 used by the substrate processing apparatus 10 of FIG. 2.

Figure 18A:
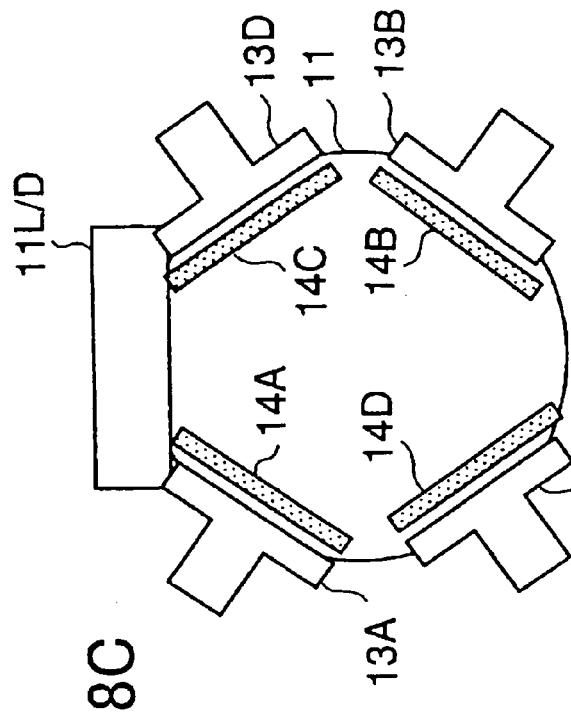
FIGS. 18A through 18D show various configurations of the substrate processing apparatuses according to the ninth embodiment of the present invention.

Among these drawings, FIG. 18A corresponds to the configuration explained previously in FIGS. 1A and 1B, wherein the processing gas supply units 13A and 13B, which are flat in shape, countering each other, are provided on both sides of the substrate-to-be-processed 12 in the processing container 11. Further, near the processing gas supply unit 13A, the exhaust opening 14B corresponding to the processing gas supply unit 13B, which is in the shape of a slit, is formed with the longitudinal side of the exhaust opening 14B being in an approximately perpendicular direction of the flow of the processing gas from the processing gas supply unit 13B to the exhaust opening 14B. Similarly, the exhaust opening 14A, having a slit shape, and corresponding to the processing gas supply unit 13A is formed so that the longitudinal direction of the exhaust opening 14A becomes approximately perpendicular to the direction in which the processing gas flows from the processing gas supply unit 13A to the exhaust opening 14A flows.

Figure 18B:
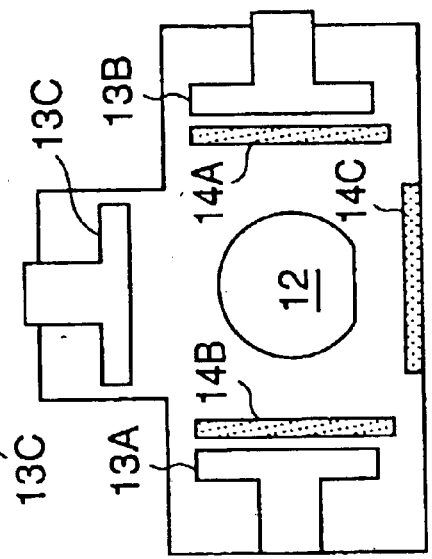

The configuration of FIG. 18B corresponds to the previous configuration shown in FIGS. 2 and 3, wherein the third processing gas supply unit 13C is formed in piles with the first processing gas supply unit 13A of the configuration of FIG. 18A.

Figure 18C:
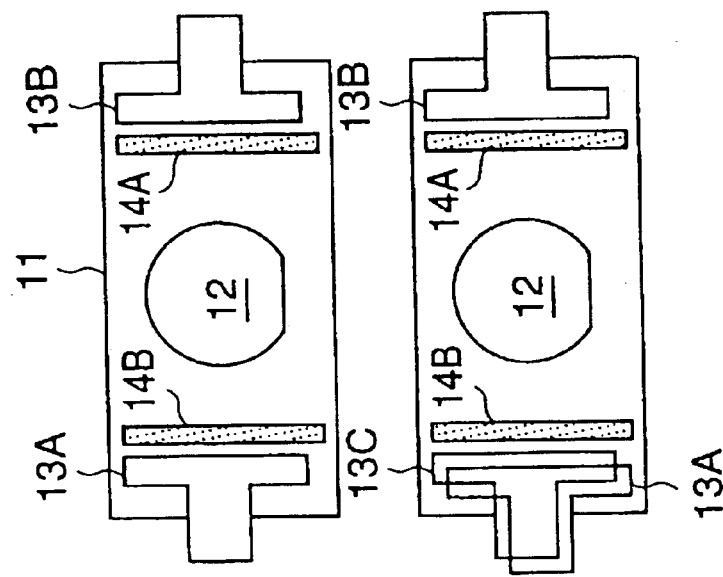

FIG. 18C shows a substrate processing chamber for constituting a cluster type processing system with another substrate processing apparatus, wherein processing gas supply units 13C and 13D, countering each other, and corresponding exhaust openings 14C and 14D are provided perpendicularly to the processing gas supply units 13A and 13B, countering each other, and the exhaust openings 14A and 14B, countering each other, respectively. Further, a load lock chamber 11L/D is provided for transporting a substrate-to-be-processed in the substrate processing chamber.

It is possible to form a high dielectric film consisting of a multi-component system by using four kinds of processing gas, each gas being laminated in single-molecule layer per process with the substrate processing apparatus of FIG. 18C.

Figure 18D:
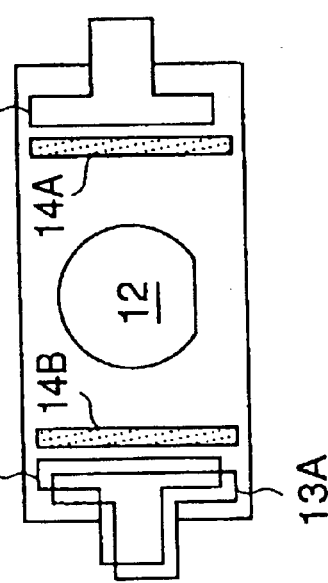

FIG. 18D shows a configuration wherein another processing gas supply unit 13C and an exhaust opening 14C, countering each other, are provided such that they intersect perpendicularly with the processing gas supply units 13A and 13B that counter mutually, and the corresponding exhaust openings 14A and 14B in the processing container 11 configured as shown in FIG. 18A.

According to the configurations as above, a high dielectric film of ZrSiO4 and the like can also be formed by laminating single-molecule layers on the substrate-to-be-processed 12.

[The Tenth Embodiment]

Figure 19:
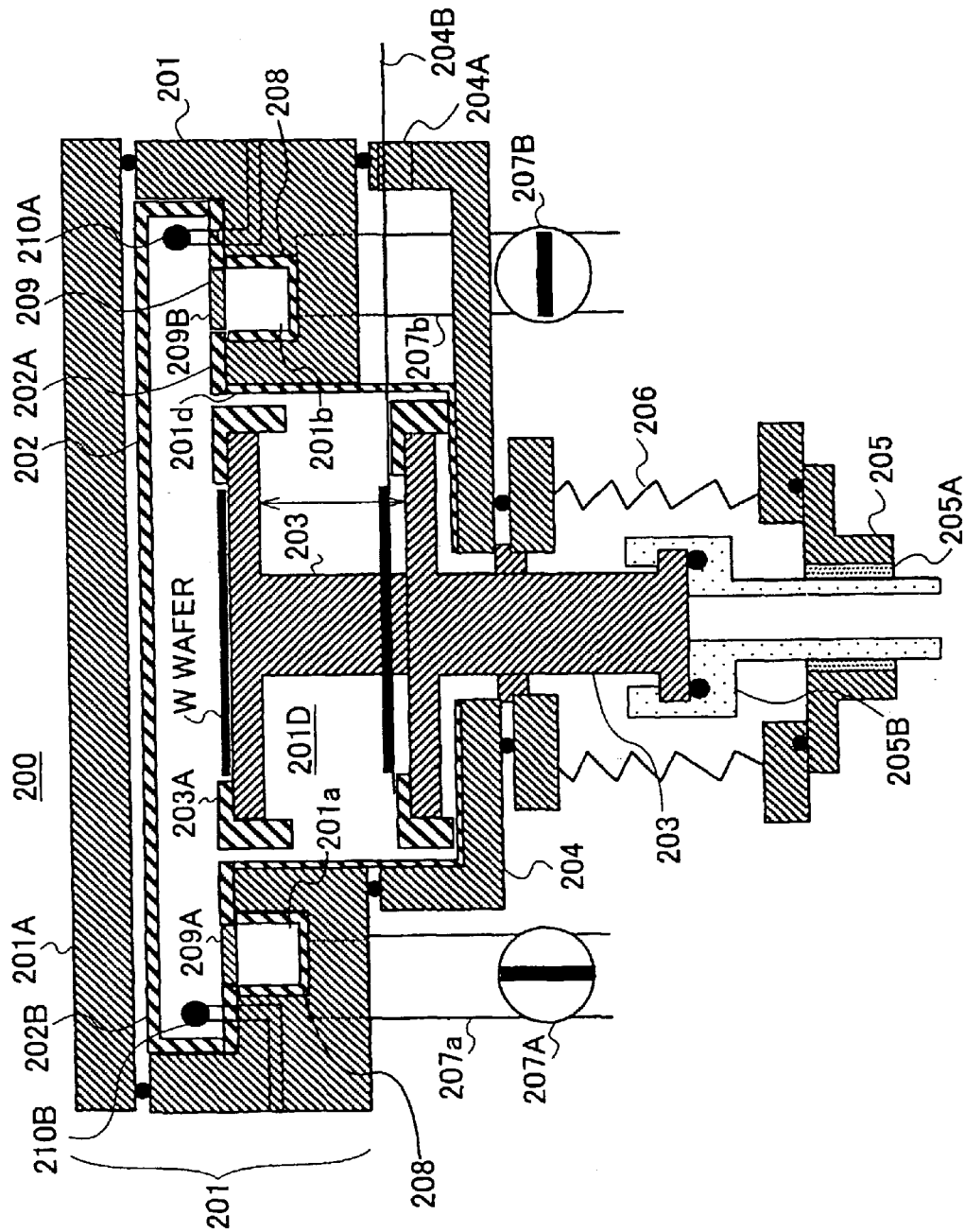
FIG. 19 shows a configuration of the substrate processing apparatus according to the tenth embodiment of the present invention.

FIG. 19 shows a configuration of the substrate processing apparatus 200 according to the tenth embodiment of the present invention.

With reference to FIG. 19, the substrate processing apparatus 200 includes an outer processing container 201 that consists of aluminum, and an inner processing container 202 that consists of silica glass, where the inner processing container 202 is provided in the outer processing container 201, and is installed in a concave portion covered by a cover plate 201A that is a part of the outer processing container 201.

The inner processing container 202 includes a quartz bottom plate 202A that covers the bottom of the outer processing container 201 in the concave part, and a quartz cover 202B that covers the quartz bottom plate 202A in the concave part. Further, a circular opening 201D is provided to the bottom of the outer processing container 201. The circular opening 201D is for providing a disk-like substrate holding stand 203 that holds a substrate-to-be-processed W. To the substrate holding stand 203, a heating mechanism, illustration of which is omitted, is provided.

The substrate holding stand 203 is held such that it can move vertically and rotate by a substrate conveyance unit 204 prepared in the lower part of the outer processing container 201. The substrate holding stand 203 is held such that is can vertically move between the highest position that is a process position and the lowest position that is a position at which the substrate is inserted and taken out (substrate in-and-out position). The process position is set at a position where the surface of the substrate-to-be-processed W on the substrate holding stand 203 is approximately on a level with the surface of the quartz bottom plate 202A.

On the other hand, the substrate in-and-out position is set at a position that corresponds to a substrate transport opening 204A provided on a side of the substrate conveyance unit 204. When the substrate holding stand 203 descends to the substrate in-and-out position, a conveyance arm 204B is inserted to a substrate transport opening 204A, the substrate-to-be-processed W lifted from the substrate holding stand 203 surface by a lifter pin (not shown) is held and taken out, and is conveyed to a next process. Further, the conveyance arm 204B transports a new substrate-to-be-processed W to the substrate conveyance unit 204 through the substrate transport opening 204A, and lays the new substrate on the substrate holding stand 203.

The substrate holding stand 203 holding the new substrate-to-be-processed W is held such that is can move vertically and rotate in a bearing unit 205 by a rotation axis 205B held by a magnetic seal 205A. Space where the rotation axis 205B moves up and down is sealed by a partition of bellows 206, and the like. Contamination during the substrate processing process performed within the inner processing container 202 is avoided by keeping the sealed space at a higher vacuum through an exhaust opening (not shown) than the inside of the inner processing container 202.

In order to ensure the differential exhaust as described above, a guard ring 203A that consists of silica glass is provided to the substrate holding stand 203 such that the substrate-to-be-processed W is surrounded. The guard ring 203A controls the conductance between the substrate holding stand 203 and a side wall of the opening 201D formed in the outer processing container 201 for accommodating the substrate holding stand. Thereby, a pressure difference is formed between the inner processing container 202 and the inside of the space formed by the bellows 206 when the space is exhausted to a high vacuum.

The side wall of the opening 201D provided to the bottom of the outer processing container 201 is covered by a quartz liner 201d, which extends further below such that the inner wall of the substrate conveyance unit 204 is covered.

At the bottom of the outer processing container 201, exhaust slits 201a and 201b are provided on both sides of the opening 201D, each slit being connected to an exhaust. Exhaust from the exhaust slit 201a is carried out through a lead pipe 207a and a conductance valve 207A. Exhaust from the exhaust slit 201b is carried out through a lead pipe 207b and a conductance valve 207B. In the state shown in FIG. 19, the conductance valve 207A is open, and the conductance valve 207B is closed. It is desirable that the conductance valves 207A and 207B, when closed, are not completely closed, but rather kept slightly open at about 3% opening in order to realize reliable opening-and-closing operations, like the previous embodiment.

The exhaust slits 201a and 201b are covered by a liner 208 that consists of silica glass, and slit-like openings 209A and 209B are provided to the quartz bottom plate 202A corresponding to the exhaust slits 201a and 201b, respectively. In the embodiment of FIG. 19, a flow straightening plate 209 (to be explained later) is prepared to each of the slit-like openings 209A and 209B in order to facilitate exhaust of gas in the inner processing container 202.

Furthermore, in the inner processing container 202, quartz gas nozzles 210A and 210B (to be explained in detail later) are provided to the exhaust slits 201a and 201b, respectively, countering each other, on both sides of the opening 201D. Then, the first processing gas supplied from the gas nozzle 210A flows along the surface of the substrate-to-be-processed W in the inner processing container 202, and is exhausted from the exhaust slit 201a that counters the conductance valve 207A. Similarly, the second processing gas supplied from the gas nozzle 210B flows along the surface of the substrate-to-be-processed W in the inner processing container 202, and is exhausted from the countering exhaust slit 201b and the conductance valve 207B. In this manner, the film formation based on atomic layers, as previously explained, is carried out by flowing the first and the second processing gases alternately from the gas nozzle 210A to the exhaust slit 201a, and from the gas nozzle 210B to the exhaust slit 201b, respectively.

Figure 20:
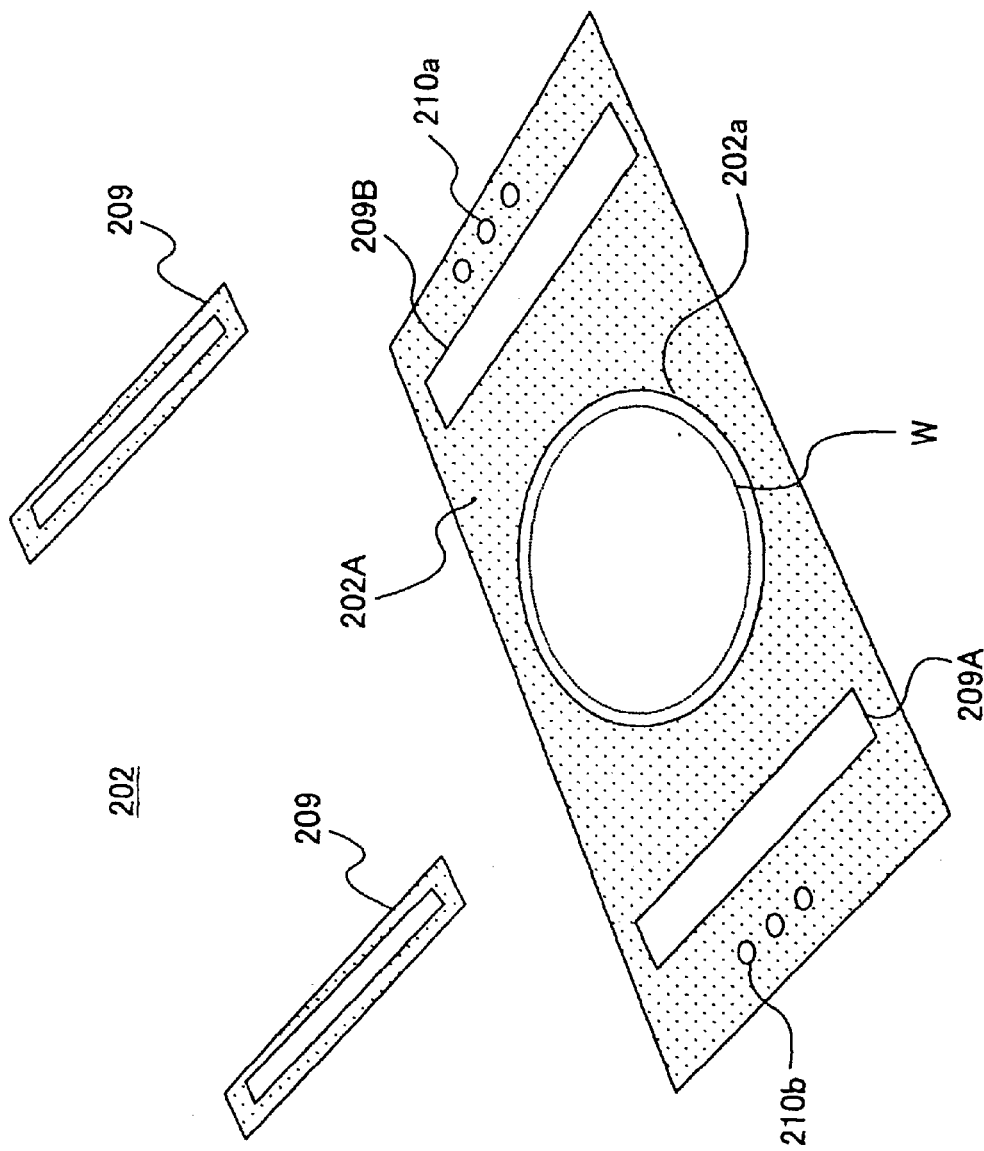
FIG. 20 shows details of a part of the substrate processing apparatuses shown by FIG. 19.

FIG. 20 shows details of the configuration of the quartz plate 202A that constitutes the inner processing container 202.

With reference to FIG. 20, a circular opening 202a is provided to the quartz bottom plate 202A corresponding to the substrate-to-be-processed W, and the openings 209A and 209B corresponding to the exhaust slits 201a and 201b, respectively, are provided on the both sides of the opening 202a. Furthermore, in the example of FIG. 20, the flow straightening plate 209 that has a slit corresponding is provided to each of the openings 209A and 209B. Further, corresponding to the gas nozzle 210A, an opening 210b is provided to the quartz bottom plate 202A, and an opening 210a is provided corresponding to the gas nozzle 210B. By forming a plurality of the openings 210a and the plurality of the gas nozzles 210b in the quartz bottom plate 202A, the plurality of gas nozzles 210A and the plurality of the gas nozzles 210B can be provided in the inner processing container 202.

FIGS. 21A through 21D show various examples $209_1$ through $209_4$, respectively, of the flow straightening plate 209.

Figure 21A:
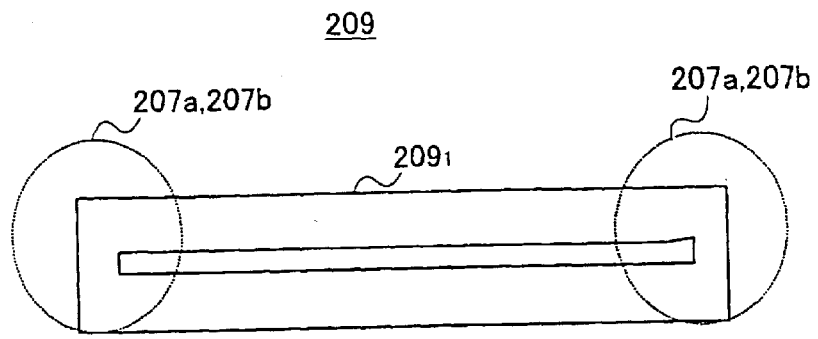
FIG. 21 shows details of a part of FIG. 20.

With reference to FIG. 21A, the flow straightening plate $209_1$ has a slit with uniform width, both ends of the slit being connected to the lead pipes 207a and 270b that are connected to the conductance valves 207A and 270B, respectively, at the exhaust slits 201a and 201b, respectively.

Figure 21B:
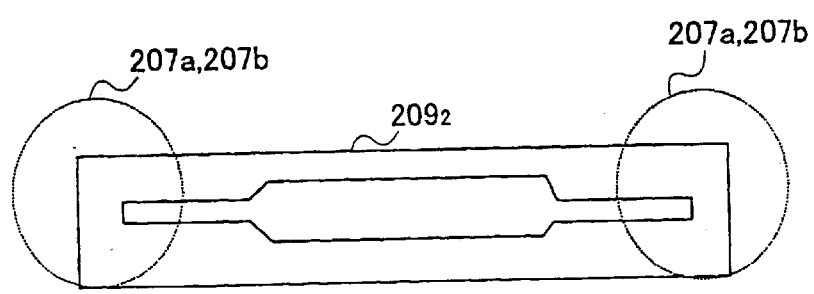

With the flow straightening plate $209_2$ shown in FIG. 21B, the width of the slit is made wider at the central part than the flow straightening plate $209_1$ of FIG. 21A, and a uniform exhaust is realized over the full length of the slit.

Figure 21C:
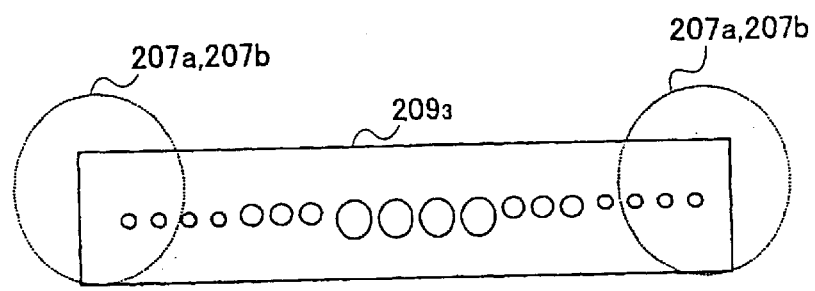
Figure 21D:
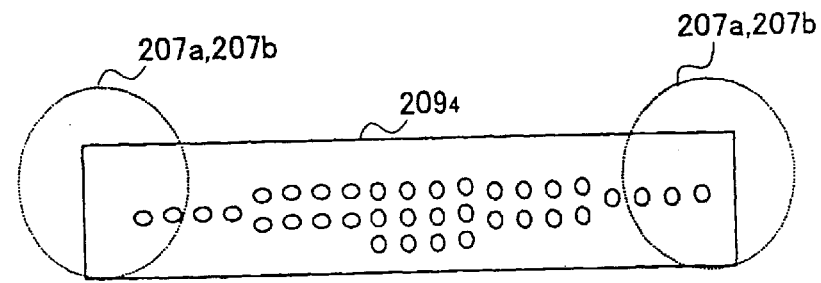

The flow straightening plate $209_3$ of FIG. 21C has a series of openings to the flow straightening plate 209, instead of the slit shown in FIGS. 21A and 21B, and the diameter of the openings is made the largest at the central part so that a uniform exhaust is realized covering the full length of the opening sequence. Further, in the case of the flow straightening plate $209_4$ of FIG. 21D, all the openings have the same diameter, however, the number of the openings is the largest at the central part so that a uniform exhaust is realized covering the full length of the opening sequence.

FIG. 22 shows a configuration of the gas nozzle 210B and corresponding exhaust slit 201b of the substrate processing apparatus 200 shown in FIG. 19, and a processing gas stream B that flows from the gas the nozzle 210B to the exhaust slit 201b. The same configuration and the same situation occur between the gas nozzle 210A and the corresponding exhaust slit 210a.

With reference to FIG. 22, the gas nozzle 210B includes a quartz pipe $210B_1$ inserted in the opening 210b of FIG. 20, and a quartz pipe ring $210B_2$ formed at the tip of the quartz pipe $210B_1$, and a number of nozzle openings are provided on the side of the quartz pipe ring $210B_2$, the side facing the exhaust slit 201b.

Then, the processing gas supplied to the quartz pipe $210B_1$ from the opening 210b flows the inside of the quartz pipe ring $210B_2$, and is discharged as the processing gas stream B that is in a sheet-like shape from the nozzle opening.

When the conductance valve 207B shown in FIG. 19 is open, the processing gas stream B flows along the surface of the substrate-to-be-processed W that is approximately on a level with the quartz bottom plate 202A, and is exhausted through the flow straightening plate 209, the exhaust slit 201b and the lead pipe 207b.

FIGS. 23A through 23C show examples of the nozzle opening that is prepared in the quartz pipe ring $210B_2$, and forms the processing gas stream B in the shape of a sheet.

With reference to FIG. 23A, the nozzle opening consists of a sequence of a plurality of openings, each having the same diameter, set in varied intervals, such that more openings are provided at the center than other places, and forms a gas stream in the desired shape of a sheet. In contrast, in the case of FIG. 23B, a plurality of the openings have different diameter from the center to each end. Further, in the configuration of FIG. 23C, a slit-like opening constitutes the nozzle opening, and slit width at the center is different from each end.

Further, as shown in FIG. 24, the gas nozzle 210B may be configured such that another quartz pipe $210B_3$, both ends of which are closed, is provided at the tip of the quartz pipe $210B_1$, the inside of the quartz pipe $210B_3$ is divided to gas supply chambers $210B_5$ and a gas discharging chamber $210B_6$ by diffusion plates $210B_4$, and nozzle openings $210b_6$ are provided in the gas discharging chamber $210B_6$. Since the substrate holding stand 203 can move up and down in the substrate processing apparatus 200 of FIG. 19, it is possible to optimize the position of the surface of the substrate-to-be-processed W in the inner processing container 202 such that the sheet-like (laminar) flow of the processing gas is formed in alignment with the quartz bottom plate 202A in the inner processing container 202.

Figure 25A:
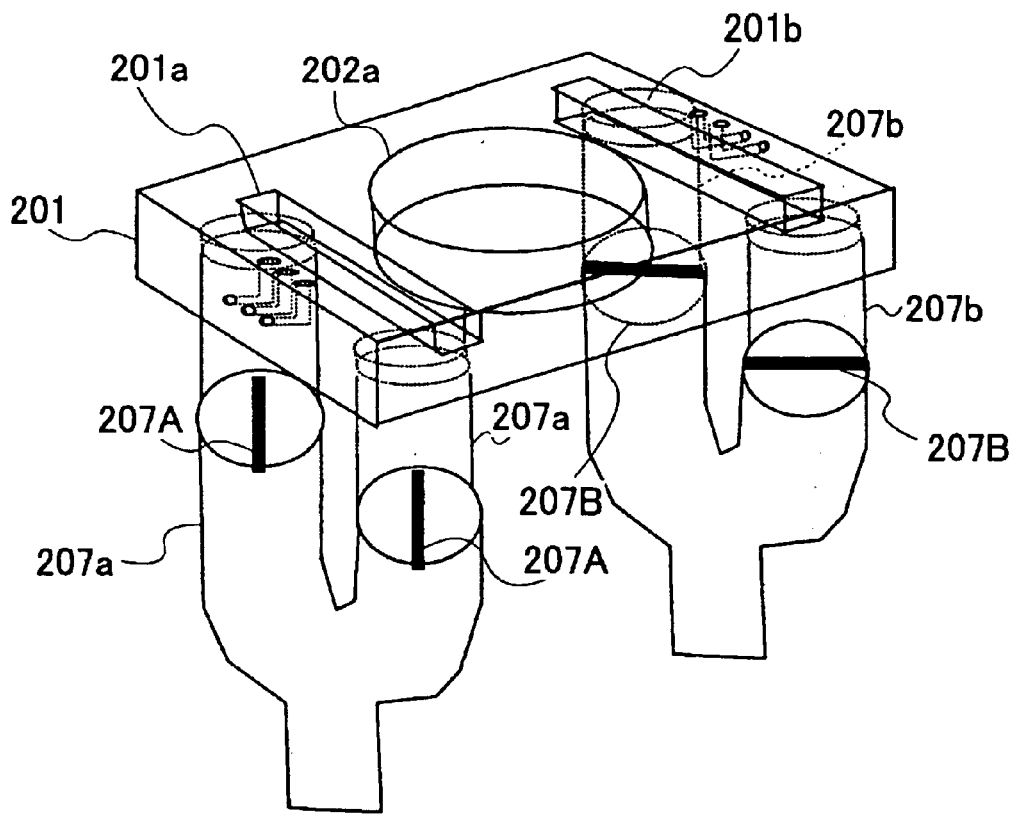
FIGS. 25A and 25B show an example of configuration of an exhaust system of the substrate processing apparatus shown by FIG. 19.
Figure 25B:
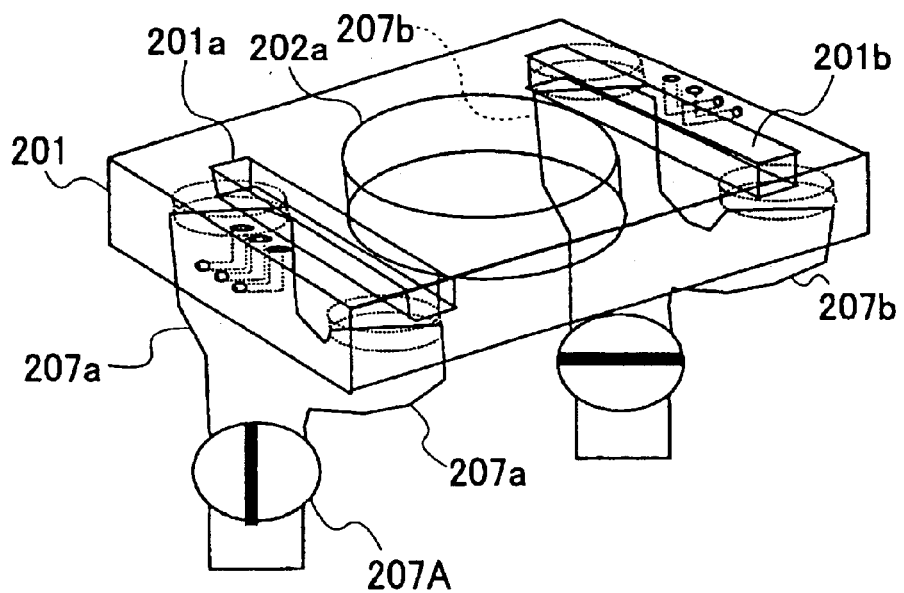
Figure 26:
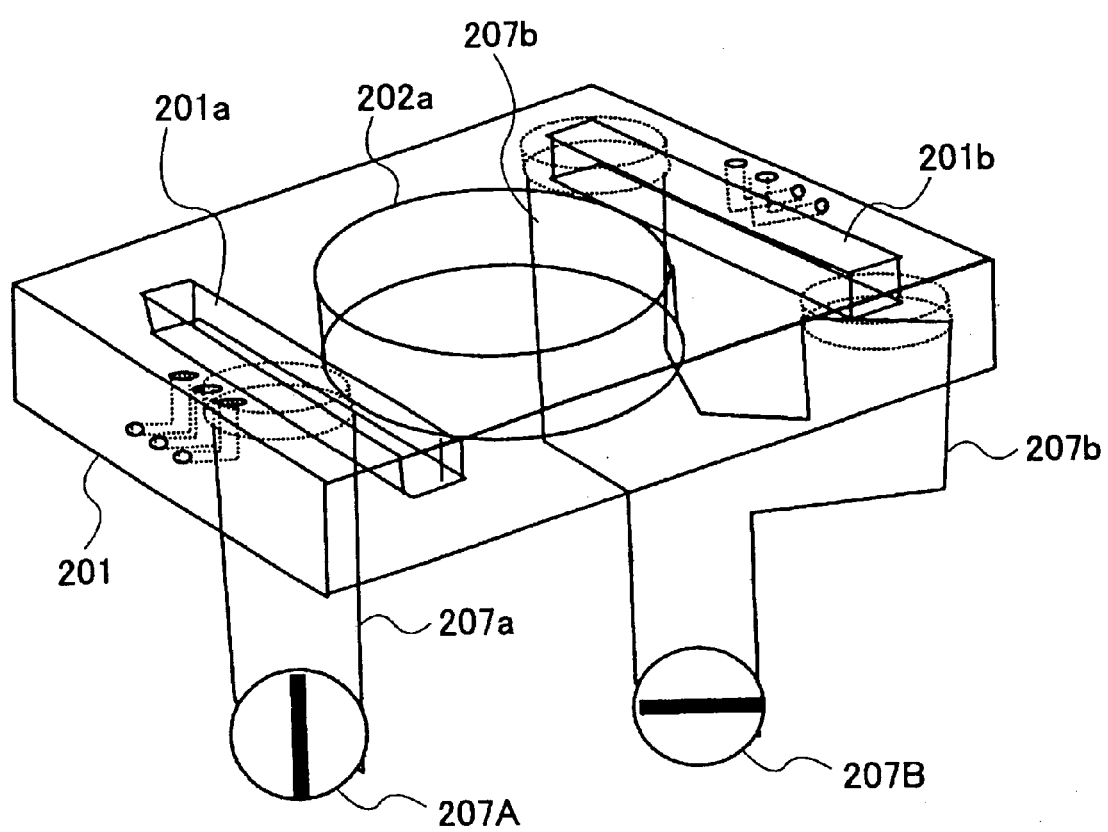
FIG. 26 shows another configuration example of the exhaust system of the substrate processing apparatus shown by FIG. 19.

FIGS. 25A, 25B, and FIG. 26 show examples of configurations of the exhaust system of the substrate processing apparatus 200.

In the example of FIG. 25A, a conductance valve 207A is provided to each of the lead pipes 207a that are connected to each end of the exhaust slit 201a; and, similarly, a conductance valve 207B is provided to each of the lead pipes 207b that are connected to each end of the exhaust slit 201b.

The pair of the conductance valves 207A are simultaneously driven at the same degree of valve opening; and, similarly, the pair of the conductance valves 207B are driven simultaneously at the same degree of valve opening.

With the configuration of FIG. 25A, it is possible to provide the conductance valves 207A and 207B in the immediate area of the exhaust slits 201a and 201b, respectively, improving the response when switching gases in the substrate processing apparatus 200.

In contrast, with the configuration of FIG. 25B, the lead pipes 207a connected to each end of the exhaust slit 201a are commonly connected to the single conductance valve 207A; and, similarly, the lead pipes 207b connected to each end of the exhaust slit 201b are commonly connected to the single conductance valve. Since the distance between the conductance valve and the exhaust slit becomes longer, the response when switching gases is degraded a little with this configuration. However, according to this example, the number of the conductance valves is decreased, and the configuration of the substrate processing apparatus 200 is simplified.

With the configuration of FIG. 26, although the exhaust configuration of the exhaust slit 201b is the same as that of FIG. 25B, the exhaust from the exhaust slit 201a is carried out through a single lead pipe 207a and a single conductance valve 207A provided in the central part. According to third configuration, it is possible to perform quick gas switching for the inner processing container 202, using the two conductance valves.

Figure 27:
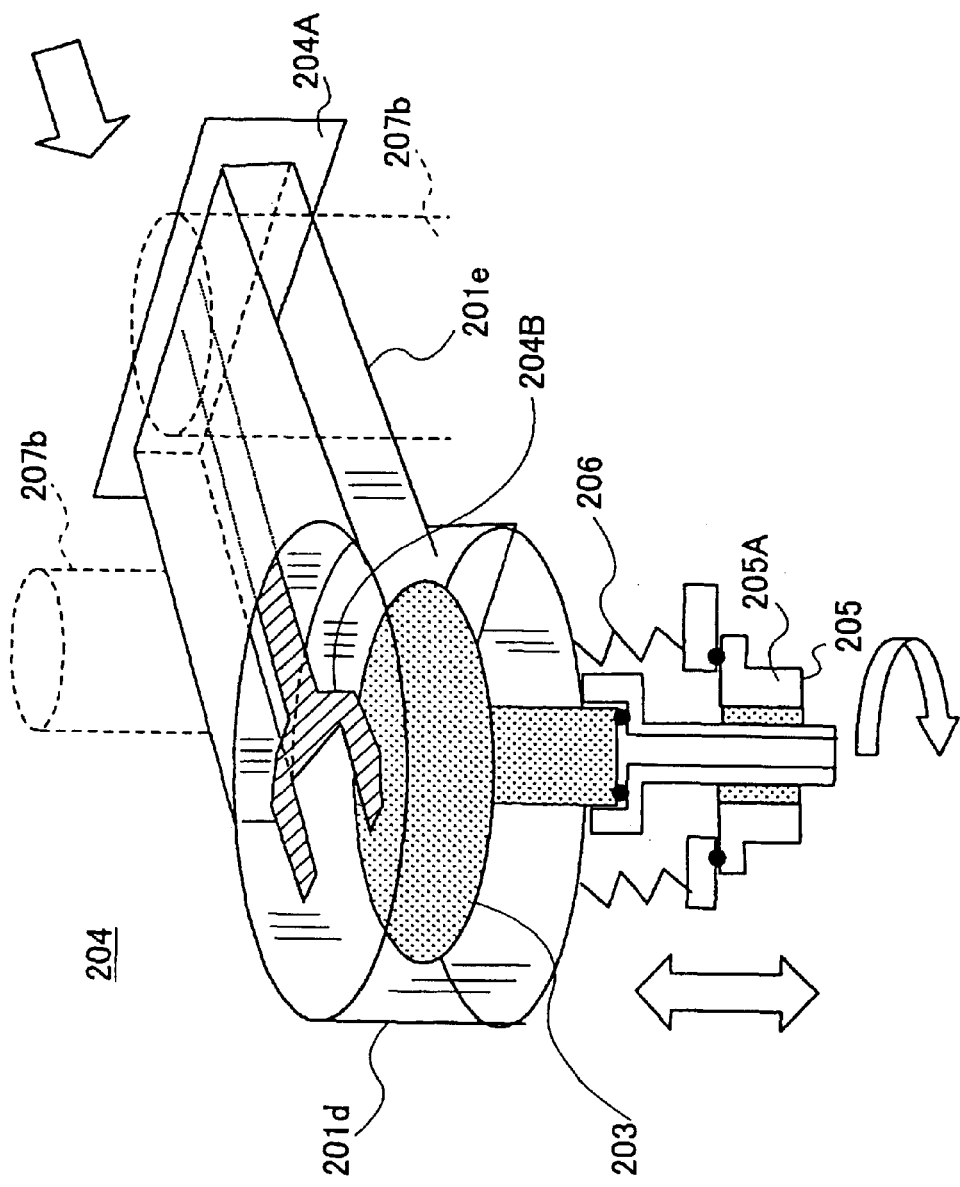
FIG. 27 shows a configuration of a substrate transporting unit of the substrate processing apparatus shown by FIG. 19.

FIG. 27 shows a configuration of the substrate conveyance unit 204 of the substrate processing apparatus 200.

With reference to FIG. 27, an extension unit 201e that surrounds the substrate conveyance way and extends to the substrate transport opening 204A is provided to a quartz sleeve unit 201d that extends from the bottom of the outer processing container 201 to the substrate conveyance unit 204, and the substrate-to-be-processed W is carried in and taken out through the extension unit 201e. Further, for this purpose, the conveyance arm 204B previously explained in FIG. 19 is inserted in the extension unit 201e. The substrate-to-be-processed W carried in by the arm 204B is raised up with the holding stand 203, and the substrate-to-be-processed W is moved to the processing position, that is, the surface of the substrate-to-be-processed W is made approximately on a level with the surface of quartz bottom plate 202A, as previously explained. The processing position can be vertically adjusted, if needed.

In the substrate processing apparatus 200 of FIG. 19, the extension unit 201e is formed between a pair of the lead pipes 207b as shown in FIG. 27.

With reference to FIG. 19, the substrate-to-be-processed W is rotated with the holding stand 203 while the substrate is being processed in the substrate processing apparatus 200. By providing this rotation mechanism, a film can be formed with uniform thickness and uniform composition on the surface of the substrate-to-be-processed.

Figure 28:
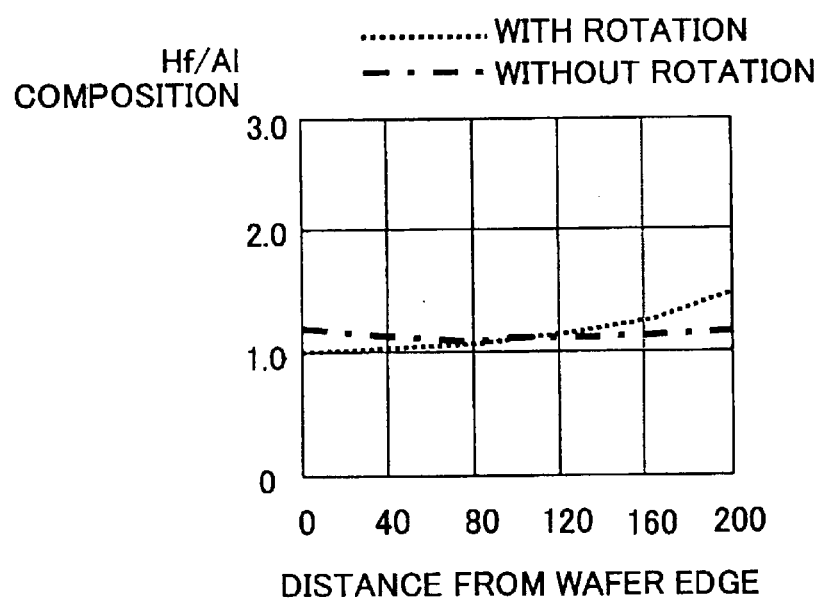
FIG. 28 shows an effect of rotating a substrate-to-be-processed in the substrate processing apparatus shown by FIG. 19.

FIG. 28 shows concentration distribution of Hf and Al in a film when forming a high dielectric film of $HfO_2$—$Al_2O_3$ system on a Si substrate using the substrate processing apparatus 200. Here, in the experiment, of which results are shown by FIG. 28, a gas nozzle 210C was prepared adjacent to the gas nozzle 210B, like the substrate processing apparatus 10 of FIG. 2; the same gas supply system as the case of FIG. 2 was used; and $HfCl_4$ gas, $H_2O$ gas, $Al(CH_3)_3$ gas, and H2O gas were repeatedly supplied according to the flowchart of FIGS. 7 through 9.

With reference to FIG. 28, where the substrate-to-be-processed W in the substrate processing apparatus 200 of FIG. 19 was not rotated, Hf concentration increased toward the center of the substrate, and where the substrate-to-be-processed W was rotated, the unevenness of the components was effectively equalized, and an almost uniform configuration profile was obtained. The same effect can also be obtained by the substrate processing apparatus 10 of FIG. 2.

In the substrate processing apparatus 200 shown in FIG. 19, the same gas supply system as shown by FIG. 2 is used. In addition, especially by providing the acoustic wave sensors 18A' and 18C' as shown in FIG. 15 for measuring acoustic speeds of the gases supplied corresponding to the valves 16A and 16C, respectively, actual partial pressure can be measured. By integrating actual gas concentration, mol number of the processing gas supplied to the processing container can be computed, which realizes accurate and efficient control of the processing sequence shown in FIG. 5, and FIGS. 7 through 9 according to the mol number, rather than time duration of a processing gas supply.

As described above, in the substrate processing apparatus of the present invention, the basic principle of which is described in reference to FIGS. 1A and 1B, containing the substrate processing apparatus 10 or the substrate processing apparatus 200, after supplying the processing gas A from the processing gas supply unit 3A to the processing container 1 in the process of FIG. 1A, when the purge gas or the processing gas B is supplied from the processing gas supply unit 3B in the process of FIG. 1B, the processing gas A that remains in the processing container 1 rides the flow of the purge gas or the processing gas B, and is discharged promptly through the exhaust opening 4B, and the residual concentration of the processing gas A in the processing container 1 falls quickly. Similarly, after supplying the processing gas B from the processing gas supply unit 3B to the processing container 1 in the process of FIG. 1B, when the process returns to the process of FIG. 1A and the purge gas or the processing gas A is supplied from the processing gas supply unit 3A, the processing gas B that remains in the processing container 1 rides the flow of the purge gas or the processing gas A, and is discharged promptly through the exhaust opening 4A, and the residual concentration of the processing gas B in the processing container 1 falls quickly.

In contrast, in the case of a substrate processing apparatus that is configured without the processing gas supply unit 3B and the corresponding exhaust opening 4B corresponding, even a gas supplied from the processing gas supply unit 3A is changed from the processing gas A to the purge gas or the processing gas B, the processing gas A tends to remain in the processing container 1, and it takes a long time for the concentration of the processing gas A to decrease to a level sufficient to carry out the next process by the processing gas B.

Figure 29:
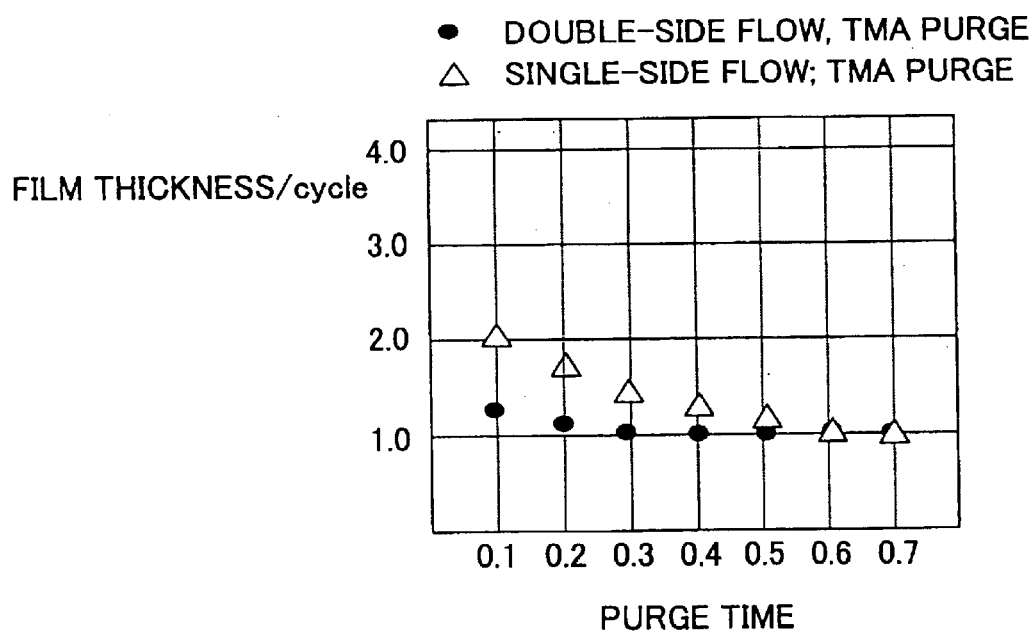
FIG. 29 shows a purge time shortening effect when processing gases are supplied alternately in the substrate processing apparatus shown by FIG. 19.

FIG. 29 shows the relations of the film thickness per process cycle and the purge time relative to the atomic layer growth of an $Al_3O_2$ film when supplying TMA gas and $H_2O$ gas alternately from the gas nozzles 210A and 210B, respectively, with the purge process inserted in-between in the substrate processing apparatus 200 of FIG. 19. FIG. 29 also shows the relations between the film thickness per process cycle and the purge time relative to the atomic layer growth of an $Al_3O_2$ film using only the gas nozzle 210A and the corresponding exhaust slit 201a in the substrate processing apparatus 200 shown in FIG. 19.

As shown in FIG. 29, when the $Al_3O_2$ growth is performed by the gas nozzles 210A and 210B alternately, the film thickness formed per process cycle almost remains a constant, even if the purge time is decreased to about 0.1 second, which indicates that the processing gas used in a previous cycle is almost completely purged out of the processing container 202 by the following cycle.

On the other hand, when only the gas nozzle 210A and the exhaust slit 210a are used, if purge time is shortened to about 0.1 second, the film thickness formed per process cycle doubles, which indicates that the processing gas of the previous process remains in the processing container 202.

The result of FIG. 29 suggests that the purge process in the control sequence of FIG. 5 and FIGS. 7 through 9 may be dispensed with, depending on requirements.

Thus, the substrate processing apparatus of the present invention has an advantage that the processing cycle time can be shortened by processing a substrate-to-be-processed alternately by the processing gases A and B.

[The Eleventh Embodiment]

FIG. 30 shows a configuration of a substrate processing apparatus 300 according to the eleventh embodiment of the present invention. In FIG. 30, the same reference numbers are given to the same portions as previously explained, and explanations thereof are not repeated.

With reference to FIG. 30, although the substrate processing apparatus 300 has a configuration similar to the substrate processing apparatus 200, the gas nozzle 210B is removed, and, instead, a remote plasma source 310 is provided to the side wall of the outer processing container 201, countering the exhaust slit 201b, on both side of the substrate-to-be-processed W.

The remote plasma source 310 is supplied with an inactive gas, such as He, Ne, Ar, Kr, and Xe, from a line 312A, and forms plasma in the inactive gas by microwave that is supplied to an electrode 311. Further, a processing gas, such as $O_2$ and $N_2$, is supplied to the remote plasma source 310; the processing gas is plasma-activated; and radicals are formed. The radicals formed in this way flow along the surface of a substrate-to-be-processed W toward the exhaust slit 201b, riding the flow of the inactive gas, while nitriding, oxidizing or oxynitriding the molecules of the processing gas, which are absorbed by the surface of the substrate-to-be-processed W.

Thus, according to the substrate processing apparatus of this embodiment, not only an oxide film, but also a nitride film and an oxynitride film can be obtained by the atomic layer growth.

In this embodiment, the source of the plasma is not limited to a remote plasma generating apparatus, but other well-known sources of plasma, such as an ICP plasma source and an ECR plasma source, can be used.

Further, the present invention is not limited to these embodiments, but various variations and modifications may be made without departing from the scope of the present invention.

AVAILABILITY TO INDUSTRY

According to the present invention, the first and the second processing gas supply units are provided such that they counter each other on both sides of a substrate-to-be-processed in the processing container, and the first and the second exhaust openings are provided such that they counter the first and the second processing gas supply units, respectively, on both sides of the substrate-to-be-processed. Then, the first processing gas is supplied to the processing container from the first processing gas supply unit; flows along the surface of the substrate-to-be-processed; and is discharged from the first exhaust opening. Then, the second processing gas or a flow of radicals is supplied from the second processing gas supply unit or the plasma source, respectively; flows along the surface of the substrate-to-be-processed; reacts with the molecules of the first processing gas, the molecules being previously adsorbed by the surface of the substrate-to-be-processed; and is discharged from the second exhaust opening. Through repeating this process, the high dielectric film is formed by laminating single-molecule layers on the substrate-to-be-processed.

What is claimed is:

1. A substrate processing apparatus comprising:
   a processing container,
   a substrate holding stand for holding a substrate-to-be-processed provided in the processing container,
   a first processing gas supply unit provided on a first side of the substrate holding stand in the processing container for supplying a first processing gas such that the first processing gas flows from the first side to a second side that counters the first side, the first processing gas flowing along the surface of the substrate-to-be-processed on the substrate holding stand,
   a first exhaust opening provided on the second side of the substrate holding stand in the processing container,
   a second processing gas supply unit provided on the second side of the substrate holding stand in the processing container for supplying a second processing gas that is different from the first processing gas such that the second processing gas flows from the second side to the first side, the second processing gas flowing along the surface of the substrate-to-be-processed on the substrate holding stand,
   a second exhaust opening provided on the first side of the substrate holding stand in the processing container,
   a first exhaust volume adjustment valve mechanism that connects the first exhaust opening to an exhaust apparatus, and
   a second exhaust volume adjustment valve mechanism that connects the second exhaust opening to the exhaust apparatus.

2. The substrate processing apparatus as claimed in claim 1, wherein the processing container further comprises an outer container, and an inner container prepared in the inside of the outer container, the substrate holding stand being prepared in the inner container.

3. The substrate processing apparatus as claimed in claim 2, wherein the substrate holding stand is capable of moving vertically, and the inner container comprises an inner container extension part that surrounds a concave area in which the substrate holding stand vertically moves.

4. The substrate processing apparatus as claimed in claim 3, wherein the surface of the substrate-to-be-processed substantially corresponds to the bottom of the inner processing container when the substrate holding stand is elevated the highest.

5. The substrate processing apparatus as claimed in claim 3, wherein a guard ring is prepared along the circumference of the substrate holding stand so that the perimeter edge of the substrate-to-be-processed is surrounded, the guard ring having a perimeter corresponding to the inner circumference of the inner container extension part, and a substantially constant clearance is formed between the perimeter of the guard ring and the inner circumference of the inner container extension part.

6. The substrate processing apparatus as claimed in claim 2, wherein a gas in the space between the outer container and the inner container is exhausted independently of the inner container.

7. The substrate processing apparatus as claimed in claim 2, wherein the inner container is made of quartz.

8. The substrate processing apparatus as claimed in claim 2, the inner container further comprising a bottom part consisting of a flat quartz plate and a quartz cover prepared on the bottom such that the bottom is covered, with the substrate-to-be-processed on the substrate holding stand being exposed in an opening provided to the quartz plate, and the exposed surface of the substrate-to-be-processed forms a plane substantially in agreement with the surface of the quartz plate.

9. The substrate processing apparatus as claimed in claim 2, further comprising a heating mechanism that is prepared in the space between the inner container and the outer container.

10. The substrate processing apparatus as claimed in claim 1, wherein the substrate holding stand is equipped with a heating mechanism.

11. The substrate processing apparatus as claimed in claim 1, further comprising a rotation mechanism for rotating the substrate holding stand.

12. The substrate processing apparatus as claimed in claim 11, wherein the rotation mechanism comprises a shaft for holding the substrate holding stand, and a magnetic seal that holds the shaft rotation-free, the magnetic seal holding the shaft vertical-movement-free in a space surrounded by bellows, and the space being decompressed to a higher vacuum state than the inside of the inner container.

13. The substrate processing apparatus as claimed in claim 1, wherein the first exhaust opening comprises a first slit that extends in a direction approximately perpendicular to the flowing direction of the first processing gas, and the second exhaust opening comprises a second slit that extends in a direction approximately perpendicular to the flowing direction of the second processing gas.

14. The substrate processing apparatus as claimed in claim 1, wherein the first exhaust opening comprises a first slit that extends in a direction approximately perpendicular to the flowing direction of the first processing gas, and the second exhaust opening comprises a second slit that extends in a direction approximately perpendicular to the flowing direction of the second processing gas, wherein exhaust from the processing container is carried out in a direction approximately perpendicular to the flow direction of the first processing gas and the second processing gas, and the extension direction of the first slit and the second slit.

15. The substrate processing apparatus as claimed in claim 13, wherein the first slit and the second slit have substantially a constant slit width.

16. The substrate processing apparatus as claimed in claim 13, wherein slit width at the central part of each of the first slit and the second slit is different from both ends of the slit.

17. The substrate processing apparatus as claimed in claim 13, wherein each of the first slit and the second slit is covered by a cover plate, and a plurality of openings are formed to the cover plate in the longitudinal direction of the slit.

18. The substrate processing apparatus as claimed in claim 17, wherein the dimensions of the openings at the central part of the slit are different from both ends of the slit.

19. The substrate processing apparatus as claimed in claim 17, wherein the density of the openings of the cover plate at the central part of the slit is different from both ends of the slit.

20. The substrate processing apparatus as claimed in claim 1, wherein the first processing gas supply unit comprises a first storing unit for storing the first processing gas, and a first discharging opening consisting of a flat slit provided to the first storing unit, and extended in a direction approximately perpendicular to the direction of the flow of the first processing gas, and the second processing gas supply unit comprises a second storing unit for storing the second processing gas, and a second discharging opening consisting of a flat slit provided to the second storing unit, extended in a direction approximately perpendicular to the direction of the flow of the second processing gas.

21. The substrate processing apparatus as claimed in claim 20, wherein the width of the flat slit at the central part of the first discharging opening and the second discharging opening differs from both ends.

22. The substrate processing apparatus as claimed in claim 20, wherein a diffusion plate that has a plurality of openings is provided to each of the first discharging opening and the second discharging opening, and the dimensions of the openings at the central part of the diffusion plate differ from the dimensions on both ends of the diffusion plate.

23. The substrate processing apparatus as claimed in claim 20, wherein a diffusion substrate that has a plurality of openings is provided to each of the first discharging opening and the second discharging opening, and the density of the openings at the central part of the diffusion plate differs from both ends.

24. The substrate processing apparatus as claimed in claim 2, wherein a space between the external container and the internal container is depressurized to a higher vacuum than the inside of the internal container.

25. The substrate processing apparatus as claimed in claim 1, wherein the first processing gas is supplied to the first processing gas supply unit from a first material container through a first material switching valve, and the second processing gas is supplied to the second processing gas supply unit from a second material container through a second material switching valve.

26. The substrate processing apparatus as claimed in claim 25, wherein the first exhaust opening comprises: a first slit that extends in a direction approximately perpendicular to the flow of the first processing gas; the second exhaust opening comprises a second slit that extends in a direction approximately perpendicular to the flow of the second processing gas; the first exhaust volume adjustment valve mechanism, further comprising a pair of exhaust volume adjustment valves that are controlled to substantially the same aperture, and connected to both ends of the first slit; and the second exhaust volume adjustment valve mechanism, further comprising a pair of exhaust volume adjustment valves that are controlled to substantially the same aperture, and connected to both ends of the second slit.

27. The substrate processing apparatus as claimed in claim 25, wherein the first exhaust opening comprises a first slit that extends in a direction approximately perpendicular to the flow of the first processing gas, the second exhaust opening comprises a second slit that extends in a direction approximately perpendicular to the flow of the second processing gas, and the first exhaust volume adjustment valve mechanism is commonly connected to both ends of the first slit through a duct.

28. The substrate processing apparatus as claimed in claim 27, wherein the second exhaust volume adjustment valve mechanism is commonly connected to the both ends of the second slit through a duct.

29. The substrate processing apparatus as claimed in claim 26, wherein the substrate holding stand is prepared vertical-movement free between a processing position that is the most elevated position and a substrate in-and-out position that is the least elevated position, and the substrate-to-be-processed is taken in-to and out from the processing container along a substrate transportation way that passes through the space between the pair of exhaust volume adjustment valves that constitute the first exhaust volume adjustment valve mechanism.

30. The substrate processing apparatus as claimed in claim 25, further comprising a control unit for controlling the first material switching valve and the second material switching valve, wherein the control unit controls the first material switching valve and the second material switching valve such that a supply of the second processing gas to the processing container from the second processing gas supply unit is intercepted when the first processing gas supply unit supplies the first processing gas to the processing container, and such that a supply of the first processing gas to the processing container from the first processing gas supply unit is intercepted when the second processing gas supply unit supplies the second processing gas to the processing container.

31. The substrate processing apparatus as claimed in claim 30, wherein the control unit controls such that an aperture of the valve opening of the first exhaust volume adjustment valve mechanism is greater than an aperture of the valve opening of the second exhaust volume adjustment valve mechanism when the first processing gas supply unit supplies the first processing gas to the processing container, and such that the aperture of the valve opening of the second exhaust volume adjustment valve mechanism is greater than the aperture of the valve opening of the first exhaust volume adjustment valve mechanism when the second processing gas supply unit supplies the second processing gas to the processing container.

32. The substrate processing apparatus as claimed in claim 31, wherein the aperture of the valve opening of the second exhaust volume adjustment valve mechanism is set at less than 3% when the first processing gas is supplied to the processing container, and the aperture of the valve opening of the first exhaust volume adjustment valve mechanism is set at less than 3% when the second processing gas is supplied to the processing container.

33. The substrate processing apparatus as claimed in claim 31, wherein the second exhaust volume adjustment valve mechanism is closed when the first processing gas is supplied to the processing container, and the first exhaust volume adjustment valve mechanism is closed when the second processing gas is supplied to the processing container.

34. The substrate processing apparatus as claimed in claim 31, wherein each of the first exhaust volume adjustment valve mechanism and the second exhaust volume adjustment valve mechanism is fully opened or opened such that a sufficient exhaust volume is obtained when the first processing gas is intercepted and before the second processing gas is supplied to the processing container, and when the second processing gas is intercepted.

35. The substrate processing apparatus as claimed in claim 1, wherein the first processing gas supply unit supplies an inactive gas to the processing container while the supply of the first processing gas is intercepted, and the second processing gas supply unit supplies an inactive gas to the processing container while the supply of the second processing gas is intercepted.

36. The substrate processing apparatus as claimed in claim 25, wherein the first material switching valve is connected to a first inactive gas line and a first exhaust line; the second material switching valve is connected to a second inactive gas line and a second exhaust line; the first material switching valve passes the inactive gas in the first inactive gas line to the first exhaust line when supplying the first processing gas to the processing container, and passes the first processing gas to the first exhaust line and supplies the inactive gas in the first inactive gas line to the processing container when the supply of the first processing gas to the processing container is intercepted; and the second material switching valve passes the inactive gas in the second inactive gas line to the second exhaust line when the second processing gas is supplied to the processing container, and passes the second processing gas to the second exhaust line and supplies the inactive gas in the second inactive gas line to the processing container when the supply of the second processing gas to the processing container is intercepted.

37. The substrate processing apparatus as claimed in claim 25, wherein each of the first exhaust volume adjustment valve mechanism and the second exhaust volume adjustment valve mechanism is fully opened or opened such that a sufficient exhaust is obtained, when the first material switching valve supplies the first inactive gas to the processing container, and the second material switching valve supplies the second inactive gas to the processing container.

38. The substrate processing apparatus as claimed in claim 30, wherein the first material container generates the first processing gas by reaction gas being supplied.

39. The substrate processing apparatus as claimed in claim 30, further comprising a flux control unit for increasing the flux of the first processing gas when the first processing gas is supplied to the processing container in comparison with when the first processing gas is intercepted, the flux control unit being provided between the first material container and the first switching valve.

40. The substrate processing apparatus as claimed in claim 25, further comprising a space for temporarily storing the first processing gas, which is prepared between the first material container and the first switching valve.

41. The substrate processing apparatus as claimed in claim 40, further comprising a pressure gauge provided to said space, the first processing gas being stored at predetermined pressure in said space.

42. The substrate processing apparatus as claimed in claim 40, further comprising a mass flux controller provided between the first material container and said space such that the first processing gas is stored in said space in predetermined quantity corresponding to accumulated flux based on the flux detected by the mass flux controller.

43. The substrate processing apparatus as claimed in claim 1, wherein the processing container is structured flat, and the first processing gas supply unit and the second processing gas supply unit supply the first processing gas and the second processing gas, respectively, as a flow in the shape of a sheet, and in parallel to the main surface of the substrate-to-be-processed.

44. The substrate processing apparatus as claimed in claim 1, wherein the processing container is structured flat, and the distance between the main surface of the substrate-to-be-processed on which the gas flows in the shape of a sheet in parallel and the bottom of the processing container is variable.

45. The substrate processing apparatus as claimed in claim 1, wherein the processing container is structured flat, and the distance between the main surface of the substrate-to-be-processed on which the gas flows in the shape of a sheet in parallel and the bottom of the processing container is set short after the substrate-to-be-processed is transported.

46. The substrate processing apparatus as claimed in claim 1, wherein each of the first exhaust opening and the second exhaust opening comprises an opening in the shape of a slit that extends in a direction approximately perpendicular to the flow of the first processing gas and the second processing gas, respectively.

47. The substrate processing apparatus as claimed in claim 1, wherein the first processing gas and the second processing gas are mixed with an inactive gas.

48. The substrate processing apparatus as claimed in claim 1, further comprising a third processing gas supply unit provided on the first side of the substrate holding stand in the processing container for supplying a third processing gas to the surface of the substrate-to-be-processed on the substrate holding stand so that the third processing gas flows toward the second side along the surface of the substrate-to-be-processed.

49. The substrate processing apparatus as claimed in claim 48, further comprising a third material container and a third material switching valve, wherein the third processing gas supply unit supplies the third processing gas from the third material container through the third material switching valve, wherein the control unit controls the first material switching valve, the second material switching valve, and the third material switching valve such that supply of the second processing gas to the processing container from the second processing gas supply unit and supply of the third processing gas to the processing container from the third processing gas supply unit are intercepted when the first processing gas supply unit supplies the first processing gas to the processing container, such that supply of the first processing gas to the processing container from the first processing gas supply unit and supply of the third processing gas to the processing container from the third processing gas supply unit are intercepted when the second processing gas supply unit supplies the second processing gas to the processing container, and such that supply of the first processing gas to the processing container from the first processing gas supply unit and supply of the second processing gas to the processing container from the second processing gas supply unit are intercepted when the third processing gas supply unit supplies the third processing gas to the processing container.

50. The substrate processing apparatus as claimed in claim 48, wherein a control unit controls the aperture of the valve opening of the first exhaust volume adjustment valve to be greater than the aperture of the valve opening of the second exhaust volume adjustment valve while the third processing gas supply unit supplies the third processing gas to the processing container.

51. The substrate processing apparatus as claimed in claim 48, wherein the third processing gas supply unit supplies an inactive gas to the processing container when the supply of the third processing gas to the processing container is intercepted.

52. The substrate processing apparatus as claimed in claim 48, wherein the third processing gas supply unit supplies the third processing gas from the first side to the second side as a flow in the shape of a sheet parallel to the main surface of the substrate-to-be-processed.

53. The substrate processing apparatus as claimed in claim 48, wherein the third material switching valve is connected to a third inactive gas line and a third exhaust line, the third material switching valve passes the inactive gas in the third inactive gas line to the third exhaust line when the third processing gas is supplied to the processing container, and passes the third processing gas to the third exhaust line, and supplies the inactive gas in the third inactive gas line to the processing container when the third processing gas is intercepted.

54. The substrate processing apparatus as claimed in claim 48, wherein the third processing gas is mixed with an inactive gas.

55. The substrate processing apparatus as claimed in claim 1, further comprising: a third processing gas supply unit provided on a third side of the substrate holding stand in the processing container, the third processing gas supply unit supplying a third processing gas to the surface of the substrate-to-be-processed on the substrate holding stand, the third processing gas flowing along the surface of the substrate-to-be-processed to a fourth side that is opposite to the third side; and a fourth exhaust opening provided on the third side of the substrate holding stand in the processing container.

56. The substrate processing apparatus as claimed in claim 55, further comprising: a fourth processing gas supply unit provided on the fourth side of the substrate holding stand in the processing container, the fourth processing gas supply unit supplying a fourth processing gas to the surface of the substrate-to-be-processed on the substrate holding stand, the fourth processing gas flowing from the fourth side to the third side along the surface of the substrate-to-be-processed; and a fourth exhaust opening provided on the third side of the substrate holding stand in the processing container.

57. The substrate processing apparatus as claimed in claim 1, wherein the first processing gas is for forming a film, and the second processing gas is for oxidization.

58. The substrate processing apparatus as claimed in claim 1, wherein the first processing gas is chosen from the group that consists of $ZrCl_4$, $ZrBr_4$, $Zr(I-OC_3H_7)_4$, $Zr(n-OC_4H_9)_4$, $Zr(t-OC_4H_9)_4$, $Zr(AcAc)_4$, $Zr(DPM)_4$, $Zr(O-iPr)(DPM)_3$, $Zr(HFA)_4$, $Zr(BH_4)_4$, $Zr(N(CH_3)_2)_4$ and $Zr(N(C_2H_5)_2)_4$, the group consisting of $(C_2H_5)_2AlN_3$, $(C_2H_5)_2AlBr$, $(C_2H_5)_2AlCl$, $(C_2H_5)_2AlI$, $(I-C_4H_9)AlH$, $(CH_3)_2AlNH_2$, $(CH_3)_2AlCl$, $(CH_3)_2AlH$, $(CH_3)_2AlH:N(CH_3)_2C_2H_5$, $AlH_3:N(CH_3)_2C_2H_5$, $Al(C_2H_5)Cl_2$, $Al(CH_3)Cl_2$, $Al(C_2H_5)_3$, $Al(I-C_4H_9)$, $Al(I-OC_4H_9)_3$, $AlCl_3$, $Al(CH_3)_3$, $AlH_3:N(CH_3)_3$, $Al(AcAc)_3$ and $Al(DPM)_3$, $Al(HFA)_3$, $Al(OC_2H_5)_3$, $Al(I-C_4H_9)_3$, $Al(I-OC_3H_7)_3$, $Al(OCH_3)_3$, $Al(n-OC_4H_9)_3$, $Al(n-OC_3H_7)_3$, $Al(sec-OC_4H_9)_3$, $Al(t-OC_4H_9)_3$ and $AlBr_3$, the group consisting of $Y(AcAc)_3$, $Y(DPM)_3$, $Y(O-iPr)(DPM)_2$, $Y(HFA)_3$, $Cp_3Y$, the group consisting of $HfCl_4$, $HfBr_4$, $Hf(AcAc)_4$, $Hf[N(C_2H_5)_2]_4$, $Hf[N(CH_3)_2]_4$, $Hf(DPM)_4$, $Hf(O-iPr)(DPM)_3$, and $Hf(HFA)_4$, the group consisting of $TiCl_4$, $TiBr_4$, $TiI_4$, $Ti(I-OCH_3)_4$, $Ti(OC_2H_5)_4$, $Ti(I-OC_3H_7)_4$, $Ti(n-OC_3H_7)_4$, $Ti(n-OC_4H_9)_4$, $Ti(AcAc)_4$, $Ti(AcAc)_2Cl_2$, $Ti(DPM)_4$, $Ti(DPM)_2Cl_2$, $Ti(O-iPr)(DPM)_3$, and $Ti(HFA)_2Cl_2$, and the group consisting of $LaBr_3$, $LaI_3$, $La(OCH_3)_3$, $La(OC_2H_5)_3$, $La(I-OC_3H_7)_2$, $Cp_3La$, $MeCp_3La$, $La(DPM)_3$, $La(HFA)_3$, $La(AcAc)_3$, $Cp(C8H8)Ti$, $Cp_2Ti[N(CH_3)_2]_2$, $Cp_2TiCl_2$, $(C_2H_5)Ti(N_3)_2$, $Ti[N(C_2H_5)_2]_4$, and $Ti[N(CH_3)_2]_4$, and the second processing gas is chosen from the group that consists of oxygen radical atoms, oxygen radical molecules, $O_3$, $O_2$, $N_2O$, $NO$, $NO_2$, $H_2O_2$, $H_2O$ and $D_2O$.

59. The substrate processing apparatus as claimed in claim 48, wherein the third processing gas is for forming a film.

60. The substrate processing apparatus as claimed in claim 48, wherein the third processing gas is different from the first processing gas, and is chosen from the group consisting of $H_2Si[N(CH_3)_2]_2$, $(C_2H_5)_2SiH_2$, $(CH_3)_2SiCl_2$, $(CH_3)_2Si(OC_2H_5)_2$, $(CH_3)_2Si(OCH_3)_2$, $(CH_3)_2SiH_2$, $C_2H_5Si$ $(OC_2H_5)_3$, $(CH_3)_3SiSi(CH_3)_3$, $HN[Si(CH_3)_3]_2$, $(CH_3)(C_6H_5)SiCl_2$, $CH_3SiH_3$, $CH_3SiCl_3$, $CH_3Si(OC_2H_5)_3$, $CH_3Si(OCH_3)_3$, $C_6H_5Si(Cl)(OC_2H_5)_2$, $C_6H_5Si(OC_2H_5)_3$, $(C_2H_5)_4Si$, $Si[N(CH_3)_2]_4$, $Si(CH_3)_4$, $Si(C_2H_5)_3H$, $(C_2H_5)_3SiN_3$, $(CH_3)_3SiCl$, $(CH_3)_3SiOC_2H_5$, $(CH_3)_3SiOCH_3$, $(CH_3)_3SiH$, $(CH_3)_3SiN_3$, $(CH_3)_3(C_2H_3)Si$, $SiH[N(CH_3)_2]_3$, $SiH[N(CH_3)_2]_3$, $Si(CH_3COO)_4$, $Si(OCH_3)_4$, $Si(OC_2H_5)_4$, $Si(I-OC_3H_7)_4$, $Si(t-OC_4H_9)_4$, $Si(n-OC_4H_9)_4$, $Si(OC_2H_5)_3F$, $HSi(OC_2H_5)_3$, $Si(I-OC_3H_7)_3F$, $Si(OCH_3)_3F$, $HSi(OCH_3)_3$, $H_2SiCl_2$, $Si_2Cl_6$, $Si_2F_6$, $SiF_4$, $SiCl_4$, $SiBr_4$, $HSiCl_3$, $SiCl_3F$, $Si_3H_8$, $SiH_2Cl_2$, $Si(C_2H_5)_2Cl_2$, and the group consisting of $(C_2H_5)_2AlN_3$, $(C_2H_5)_2AlBr$, $(C_2H_5)_2AlCl$, $(C_2H_5)_2AlI$, $(I-C_4H_9)AlH$, $(CH_3)_2AlNH_2$, $(CH_3)_2AlCl$, $(CH_3)_2AlH$, $(CH_3)_2\ AlH:N(CH_3)_2C_2H_5$, $AlH_3:N(CH_3)_2C_2H_5$, $Al(C_2H_5)Cl_2$, $Al(CH_3)\ Cl_2$, $Al(C_2H_5)_3$, $Al(I-C_4H_9)Al$, $Al(I-OC_4H_9)_3AlCl_3$, $Al(CH_3)_3$, $AlH_3:N(CH_3)_3$, $Al(AcAc)_3$, $Al(DPM)_3$, $Al(HFA)_3$, $Al(OC_2H_5)_3$, $Al(I-C_4H_9)_3$, $Al(I-OC_3H_7)_8$, $Al(OCH_3)_3$, $Al(n-OC_4H_9)_3$, $Al(n-OC_3H_7)_3$, $Al(sec-OC_4H_9)_3$, $Al(t-OC_4H_9)_3$, and $AlBr_3$.

61. The substrate processing apparatus as claimed in claim 1, wherein a first switching valve comprises:
   a switching valve container,
   a ceramic valve element prepared rotation-free in the switching valve container,
   a magnetic unit that is combined in one body with the ceramic valve element in the switching valve container, and
   an electromagnetic driving unit that is magnetically combined with the magnetic body, and prepared outside of the switching valve container, wherein a slot is formed to the ceramic valve element.

62. A substrate processing method using a substrate processing apparatus equipped with a processing container, a substrate holding stand prepared for holding a substrate-to-be-processed in the processing container, a first processing gas supply unit provided on a first side of the substrate holding stand in the processing container, a first exhaust opening provided on a second side countering the first side of the substrate holding stand in the processing container, a second processing gas supply unit provided on the second side of the substrate holding stand in the processing container, and a second exhaust opening provided on the first side of the substrate holding stand in the processing container, comprising:
   a first step for performing a first process on the surface of the substrate-to-be-processed, wherein the first processing gas supply unit supplies a first processing gas from the first side to the second side along the surface of the substrate-to-be-processed, and the discharging volume of the second exhaust opening is controlled to be less than the discharging volume of the first exhaust opening, and
   a second step for performing a second process on the surface of the substrate-to-be-processed, wherein the second processing gas supply unit supplies a second processing gas that is different from the first processing gas from the second side to the first side along the surface of the substrate-to-be-processed, and the discharging volume of the first exhaust opening is controlled to be less than the discharging volume of the second exhaust opening.

63. The substrate processing method as claimed in claim 62, wherein an inactive gas is supplied to the processing container from the second processing gas supply unit in the first step, and an inactive gas is supplied to the processing container from the first processing gas supply unit in the second step.

64. A substrate processing apparatus comprising:
   a processing container,
   a substrate holding stand prepared for holding a substrate-to-be-processed in the processing container,
   a processing gas supply unit provided on a first side of the substrate holding stand in the processing container for supplying a processing gas to the surface of the substrate-to-be-processed on the substrate holding stand, wherein the processing gas flows along the surface of the substrate-to-be-processed from the first side to a second side that counters the first side,
   a first exhaust opening provided on the second side of the substrate holding stand in the processing container,
   a radical source provided on the second side of the substrate holding stand in the processing container for supplying radicals to the surface of the substrate-to-be-processed on the substrate holding stand such that the radicals flow along the surface of the substrate-to-be-processed from the second side to the first side, and
   a second exhaust opening provided on the first side of the substrate holding stand in the processing container.

65. The substrate processing apparatus as claimed in claim 64, wherein the radical source comprises a source of plasma provided on a side wall portion of the processing container.

66. The substrate processing apparatus as claimed in claim 1, wherein the second processing gas has reactivity to the first processing gas.

67. The substrate processing apparatus as claimed in claim 62, wherein the second processing gas has reactivity to the first processing gas.

* * * * *